US012684967B2

(12) United States Patent
Choi et al.

(10) Patent No.: US 12,684,967 B2
(45) Date of Patent: Jul. 14, 2026

(54) DISPLAY DEVICE WITH DATA CONNECTION LINES CONNECTED TO DATA LINES

(71) Applicant: Samsung Display Co., LTD., Yongin-si (KR)

(72) Inventors: Yoon Sun Choi, Hwaseong-si (KR); Seung Hwan Cho, Yongin-si (KR); Won Suk Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 801 days.

(21) Appl. No.: 18/072,502

(22) Filed: Nov. 30, 2022

(65) Prior Publication Data

US 2023/0189590 A1 Jun. 15, 2023

(30) Foreign Application Priority Data

Dec. 10, 2021 (KR) ........................ 10-2021-0176173

(51) Int. Cl.
H10K 59/131 (2023.01)
H10K 59/88 (2023.01)

(52) U.S. Cl.
CPC ........... H10K 59/131 (2023.02); H10K 59/88 (2023.02)

(58) Field of Classification Search
CPC .............................. H10K 59/131; H10K 59/88
See application file for complete search history.

(56) References Cited

U.S. PATENT DOCUMENTS

| | | | |
|---|---|---|---|
| 9,965,992 B2 | 5/2018 | Kim | |
| 11,580,914 B2 | 2/2023 | Cho et al. | |
| 12,217,706 B2 | 2/2025 | Cho et al. | |
| 2016/0225304 A1* | 8/2016 | Kim | G09G 3/3666 |
| 2021/0020724 A1* | 1/2021 | Cho | H10D 86/60 |
| 2021/0134907 A1* | 5/2021 | Kim | H10K 59/124 |
| 2021/0265448 A1* | 8/2021 | Son | H10K 59/88 |
| 2022/0005886 A1* | 1/2022 | Jeong | H10K 59/88 |

(Continued)

FOREIGN PATENT DOCUMENTS

| | | |
|---|---|---|
| EP | 3817064 A1 | 5/2021 |
| EP | 3876282 A1 | 9/2021 |
| EP | 3916795 A1 | 12/2021 |

(Continued)

*Primary Examiner* — Lex H Malsawma
(74) *Attorney, Agent, or Firm* — Womble Bond Dickinson (US) LLP

(57) ABSTRACT

A display device includes: a plurality of first data lines extending in a second direction intersecting a first direction; a plurality of second data lines extending in the second direction and are spaced apart from the first data lines; a plurality of data connection lines connected to the first data lines, respectively; a plurality of vertical dummy patterns spaced apart from the data connection lines and extending in the second direction; and a plurality of horizontal power supply lines in a display area and extending in the first direction and configured to receive a power supply voltage, wherein a first separation portion by which any one data connection line among the data connection lines is spaced apart from any one vertical dummy pattern among the vertical dummy patterns overlaps any one horizontal power supply line among the horizontal power supply lines.

19 Claims, 31 Drawing Sheets

(56)                     References Cited

U.S. PATENT DOCUMENTS

2023/0165091 A1*   5/2023   Xu ..................... H10K 59/1213
                                                          257/91
2025/0182706 A1    6/2025   Cho et al.

FOREIGN PATENT DOCUMENTS

KR      10-2016-0016969  A      2/2016
KR      10-2016-0095238  A      8/2016
KR      10-2021-0053381  A      5/2021
KR      10-2021-0107189  A      9/2021
KR      10-2021-0148547  A     12/2021

* cited by examiner

FIG. 4

ACT: DTCH, DTS, DTD, CH2, S2, D2, CH6, S6, D6
GTL1: DTG, G1, G6
GTL2: HVDL
DTL1: CE1, CE2, CE3, VVDL
DTL2: CE4, CE5, HPL2
DTL3: CE6, DL2, VDP

DR3
DR2
DR1

ACT: CH4, S4
GTL1: G4
GTL2: HVAIL
DTL2: DCL2
DTL3: DCL1

ACT: DTS
GTL2: HVDL
DTL2: HPL2
DTL3: DCL1, VDP

GTL1: GBL
GTL2: HVAIL
DTL2: HPL2
DTL3: DCL1, VDP

FIG. 30

GTL1: FL1, PDL1
DTL1: BCE, SPL1, PDE1
DTL2: SPL2, PDE2, BL1

FIG. 31

GTL1: FL1, PDL1
DTL1: BCE, SPL1, PDE1
DTL2: SPL2, PDE2, BL1

DISPLAY DEVICE WITH DATA CONNECTION LINES CONNECTED TO DATA LINES

CROSS-REFERENCE TO RELATED APPLICATION

The present application claims priority to, and the benefit of, Korean Patent Application No. 10-2021-0176173 filed on Dec. 10, 2021 in the Korean Intellectual Property Office (KIPO), the entire content of which is incorporated herein by reference.

BACKGROUND

1. Field

Aspects of some embodiments of the present disclosure relate to a display device.

2. Description of the Related Art

As the information society develops, consumer demand for display devices for displaying images is increasing in various forms. For example, display devices are being utilized in various electronic devices such as smartphones, digital cameras, notebook computers, navigation devices, and smart televisions.

A display device may further include pixels configured to emit light based on data signals or data voltages, scan lines for driving the pixels, data lines, power supply lines, a scan driver outputting scan signals to the scan lines, and a display driver outputting data voltages to the data lines.

A display device may include a display area which includes the pixels to display images and a non-display area, which is arranged around the display area (e.g., in a periphery, or outside a footprint of, the display area). Recently, the area of the non-display area in the display device has been minimized or reduced. Due to this, however, a space for placing fan-out lines connecting the display driver and the data lines in the non-display area may be insufficient in some instances.

The above information disclosed in this Background section is only for enhancement of understanding of the background and therefore the information discussed in this Background section does not necessarily constitute prior art.

SUMMARY

Aspects and characteristics of some embodiments of the present disclosure include a display device, which can solve a lack of space for placing fan-out lines due to a reduction in the area of a non-display area.

However, embodiments of the present disclosure are not limited to the characteristics set forth herein. The above and other embodiments of the present disclosure will become more apparent to one of ordinary skill in the art to which the present disclosure pertains by referencing the detailed description of the present disclosure given below.

According to one or more embodiments of the present disclosure, there is provided a display device including a plurality of first data lines which extend in a second direction intersecting a first direction, a plurality of second data lines which extend in the second direction and are spaced apart from the first data lines, a plurality of data connection lines which are connected to the first data lines, respectively, a plurality of vertical dummy patterns which are spaced apart from the data connection lines and extend in the second direction, and a plurality of horizontal power supply lines which are in a display area and extend in the first direction and to which a power supply voltage is applied. According to some embodiments, a first separation portion by which any one data connection line among the data connection lines is spaced apart from any one vertical dummy pattern among the vertical dummy patterns overlaps any one horizontal power supply line among the horizontal power supply lines.

According to some embodiments, a second separation portion by which another data connection line among the data connection lines may be spaced apart from another vertical dummy pattern among the vertical dummy patterns does not overlap the horizontal power supply lines.

According to some embodiments, each of the another data connection line and the another vertical dummy pattern may include a first wiring portion having a first width and a second wiring portion having a second width greater than the first width.

According to some embodiments, the first separation portion may be defined as a gap between the first wiring portion of the data connection line and the first wiring portion of the vertical dummy pattern.

According to some embodiments, the second separation portion may be defined as a gap between the first wiring portion of the another data connection line and the second wiring portion of the another vertical dummy pattern or a gap between the second wiring portion of the another data connection line and the first wiring portion of the another vertical dummy pattern.

According to some embodiments, the second separation portion may be defined as a gap between the second wiring portion of the another data connection line and the second wiring portion of the another vertical dummy pattern.

According to some embodiments, each of the data connection lines may include a first data connection line extending in the second direction, and a second data connection line extending in the first direction.

According to some embodiments, the first data lines, the second data lines, the vertical dummy patterns, and the first data connection line may include the same material and on the same layer.

According to some embodiments, the horizontal power supply lines and the second data connection line may include the same material and on the same layer.

According to one or more embodiments of the present disclosure, there is provided a display device including a plurality of first horizontal power supply lines which extend in a first direction and to which a first power supply voltage is applied, a plurality of second horizontal power supply lines which extend in the first direction and to which a second power supply voltage higher than the first power supply voltage is applied, a plurality of first data lines which extend in a second direction intersecting the first direction, a plurality of second data lines which extend in the second direction and are spaced apart from the first data lines, a plurality of data connection lines which are connected to the first data lines, respectively, and a plurality of vertical dummy patterns which are spaced apart from the data connection lines and extend in the second direction. According to some embodiments, any one first horizontal power supply line among the first horizontal power supply lines is connected to any one vertical dummy pattern among the vertical dummy patterns.

According to some embodiments, the display device may further include a plurality of horizontal dummy patterns which extend in the first direction, and a plurality of vertical power supply lines which extend in the second direction and to which the first power supply voltage is applied. According to some embodiments, any one vertical power supply line among the vertical power supply lines is connected to any one horizontal dummy pattern among the horizontal dummy patterns.

According to some embodiments, a first separation portion by which any one data connection line among the data connection lines may be spaced apart from any one vertical dummy pattern among the vertical dummy patterns may overlap any one second horizontal power supply line among the second horizontal power supply lines.

According to some embodiments, a second separation portion by which any one data connection line among the data connection lines may be spaced apart from any one vertical dummy pattern among the vertical dummy patterns may not overlap the second horizontal power supply lines.

According to one or more embodiments of the present disclosure, there is provided a display device including a first display area which comprises a first sub-display area and a second sub-display area, a second display area which neighbors the first display area in a first direction, a plurality of first data lines which are in the first sub-display area and extend in a second direction intersecting the first direction, a plurality of first data connection lines, which are in the second sub-display area and extend in the second direction, a plurality of second data connection lines, which are in the first sub-display area and the second sub-display area and extend in the first direction, and a plurality of first connection holes through which the first data connection lines and the second data connection lines are respectively connected to each other in the second sub-display area. According to some embodiments, the first connection holes are arranged in a first diagonal direction between the first direction and the second direction in the second sub-display area.

According to some embodiments, the display device may further include a plurality of second connection holes through which the second data connection lines and the first data lines are respectively connected to each other in the first sub-display area. The second connection holes may be arranged in a second diagonal direction intersecting the first diagonal direction in the first sub-display area.

According to some embodiments, the display device may further include a plurality of second data lines, which are in the second sub-display area, extend in the second direction, and are spaced apart from the first data connection lines.

According to some embodiments, the display device may further include a third display area which neighbors the first display area in the second direction and comprises a third sub-display area and a fourth sub-display area, a plurality of first horizontal power supply lines, which are in the third sub-display area and the fourth sub-display area and extend in the first direction and to which a first power supply voltage is applied, and a plurality of vertical dummy patterns, which are in the second sub-display area and the fourth sub-display area and extend in the second direction.

According to some embodiments, the display device may further include a plurality of first power holes through which the first horizontal power supply lines and the vertical dummy patterns are respectively connected to each other in the fourth sub-display area. According to some embodiments, the first power holes may be arranged in the first diagonal direction between the first direction and the second direction in the fourth sub-display area.

According to some embodiments, the display device may further include a plurality of vertical power supply lines, which are in the third sub-display area and extend in the second direction, and a plurality of second power holes through which the first horizontal power supply lines and the vertical power supply lines are respectively connected to each other in the third sub-display area. According to some embodiments, the second power holes may be arranged in the second diagonal direction intersecting the first diagonal direction in the third sub-display area.

According to some embodiments, the display device may further include a plurality of horizontal dummy patterns, which are in the first sub-display area and the second sub-display area and extend in the first direction, and a plurality of third power holes through which the horizontal dummy patterns and the vertical power supply lines are respectively connected to each other in the first sub-display area. According to some embodiments, the vertical power supply lines may extend in the second direction in the first sub-display area, and the third power holes may be arranged in the second diagonal direction in the first sub-display area.

According to some embodiments of the present disclosure, a plurality of first data lines on left and right sides of a display panel are connected to first fan-out lines through data connection lines. Accordingly, there may be no need for the first fan-out lines to be in a non-display area on a lower side of the display panel so as to be connected to the first data lines adjacent to left and right sides of a display area. Therefore, even when the area of the non-display area on the lower side of the display panel is reduced, a space for placing the fan-out lines may not be insufficient.

According to some embodiments of the present disclosure, a first separation portion between a data connection line and a vertical dummy pattern is arranged to overlap a second horizontal power supply line, or a second separation portion between a data connection line and a vertical dummy pattern is arranged to not overlap the second horizontal power supply line. Therefore, it may be possible to prevent or reduce a pattern due to a step of a pixel electrode from being recognized by a user.

According to some embodiments of the present disclosure, the second separation portion is formed between a second wiring portion of a first data connection line which has a second width and a first wiring portion of a vertical dummy pattern which has a first width or between the second wiring portion of the first data connection line which has the first width and a second wiring portion of the vertical dummy pattern which has the second width. Alternatively, the second separation portion may be formed between the second wiring portion of the first data connection line which has the second width and the second wiring portion of the vertical dummy pattern which has the second width. Therefore, instances of the second separation portion being over-etched during an etching process may be prevented or reduced.

BRIEF DESCRIPTION OF THE DRAWINGS

The above and other features and characteristics of embodiments according to the present disclosure will become more apparent by describing aspects of some embodiments thereof with reference to the attached drawings, in which:

FIG. 4 is a detailed layout view of the area A of FIG. 2;

FIG. 30 is a cross-sectional view illustrating an example of a first fan-out line, a first bending line, and a first pad line according to some embodiments; and FIG. 31 is a cross-sectional view illustrating an example of a second fan-out line, a second bending line, and a second pad line according to some embodiments.

DETAILED DESCRIPTION

Figure 1:
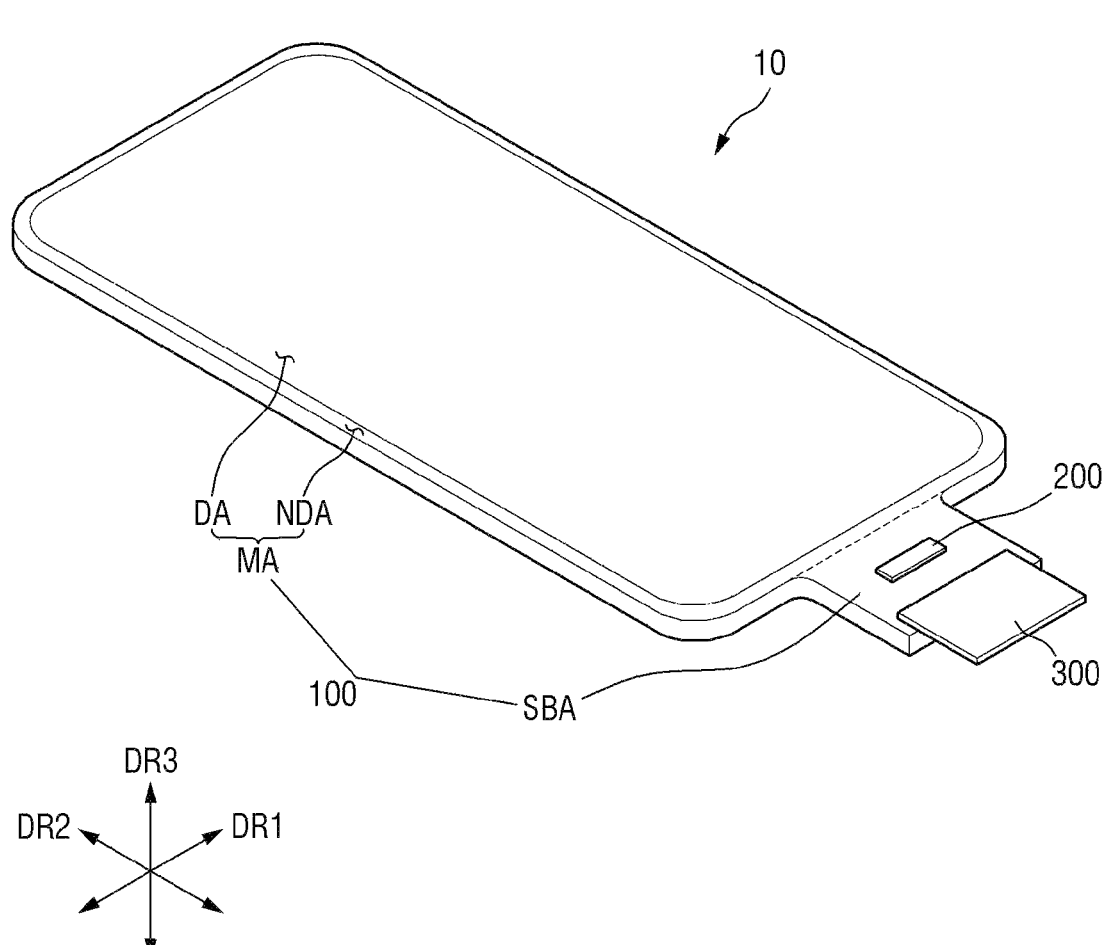
FIG. 1 is a perspective view of a display device according to some embodiments.

Aspects and features of embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure might not be described.

Unless otherwise noted, like reference numerals, characters, or combinations thereof denote like elements throughout the attached drawings and the written description, and thus, descriptions thereof will not be repeated. Further, parts not related to the description of one or more embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, the term "and/or" includes any and all combinations of one or more of the associated listed items. For example, the expression such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When one or more embodiments may be implemented differently, a specific process order may be performed differently from the described order. For example, two consecutively described processes may be performed substantially at the same time or performed in an order opposite to the described order.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of embodiments of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a perspective view of a display device 10 according to some embodiments.

Referring to FIG. 1, the display device 10 is a device for displaying moving images (e.g., video images) or still images (e.g., static images). The display device 10 may be used as a display screen in portable electronic devices such as mobile phones, smartphones, tablet personal computers (PCs), smart watches, watch phones, mobile communication terminals, electronic notebooks, electronic books, portable multimedia players (PMPs), navigation devices and ultra-mobile PCs (UMPCs), as well as in various products such as televisions, notebook computers, monitors, billboards and the Internet of things (IoT).

The display device 10 may be a light emitting display device such as an organic light emitting display device using an organic light emitting diode, a quantum dot light emitting display device including a quantum dot light emitting layer, an inorganic light emitting display device including an inorganic semiconductor, or a micro- or nano-light emitting display device using a micro- or nano-light emitting diode. An embodiment in which the display device 10 is an organic light emitting display device will be mainly described below, but embodiments according to the present disclosure are not limited thereto.

The display device 10 includes a display panel 100, a display driving circuit 200, and a circuit board 300.

The display panel 100 may have a rectangular plane shape having short sides in a first direction DR1 and long sides in a second direction DR2 intersecting (e.g., perpendicular to) the first direction DR1. Each corner where a short side extending in the first direction DR1 meets a long side extending in the second direction DR2 may be rounded with a predetermined curvature or may be right-angled. The planar shape of the display panel 100 is not limited to the quadrangular shape but may also be another polygonal shape, a circular shape, or an oval shape. The display panel 100 may be formed flat, but embodiments according to the present disclosure are not limited thereto. For example, the display panel 100 may include curved parts formed at left and right ends and having a constant or varying curvature. In addition, the display panel 100 may be formed to be flexible so that it can be curved, bent, folded or rolled.

A substrate SUB of the display panel 100 may include a main area MA and a sub-area SBA.

The main area MA may include a display area DA configured to display images and a non-display area NDA arranged around the display area DA. The display area DA may include subpixels SPX (see FIG. 5) that display images. The sub-area SBA may protrude from a side of the main area MA in the second direction DR2.

Although the sub-area SBA is unfolded in FIG. 1, it may also be bent, in which case the sub-area SBA may be located on a lower surface of the display panel 100. When the sub-area SBA is bent, it may be overlapped by the main area MA in a thickness direction DR3 of the substrate SUB. The display driving circuit 200 may be located in the sub-area SBA.

The display driving circuit 200 may generate signals and voltages for driving the display panel 100. The display driving circuit 200 may be formed as an integrated circuit and attached onto the display panel 100 using a chip-on-glass (COG) method, a chip-on-plastic (COP) method, or an ultrasonic bonding method. However, embodiments according to the present disclosure are not limited thereto. For example, the display driving circuit 200 may also be attached onto the circuit board 300 using a chip-on-film (COF) method.

The circuit board 300 may be attached to an end of the sub-area SBA of the display panel 100. Therefore, the circuit board 300 may be electrically connected to the display panel 100 and the display driving circuit 200. The display panel 100 and the display driving circuit 200 may receive digital video data, timing signals, and driving voltages through the circuit board 300. The circuit board 300 may be a flexible printed circuit board, a printed circuit board, or a flexible film such as a chip-on-film.

Figure 2:
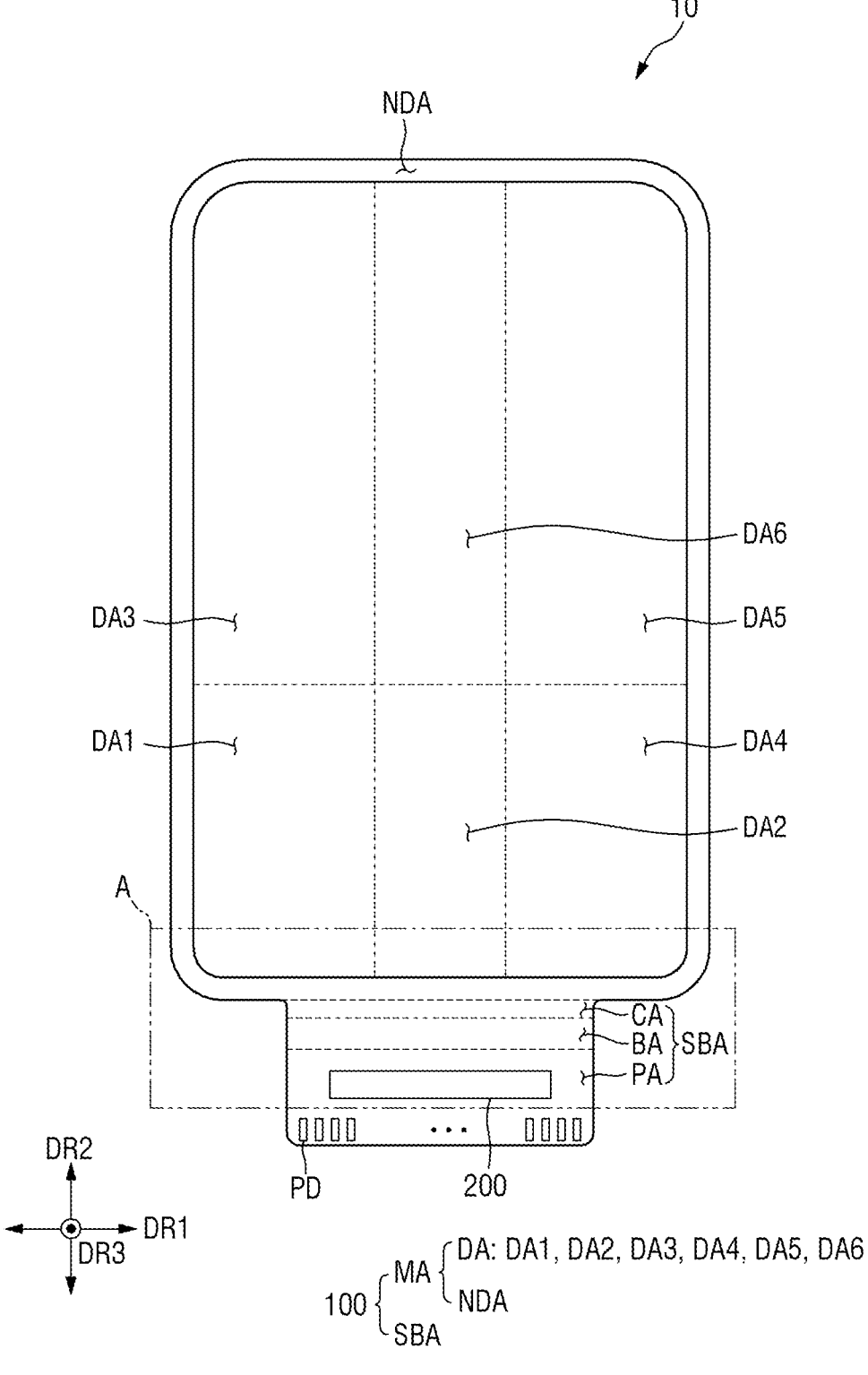
FIG. 2 is a plan view of the display device according to some embodiments.
Figure 3:
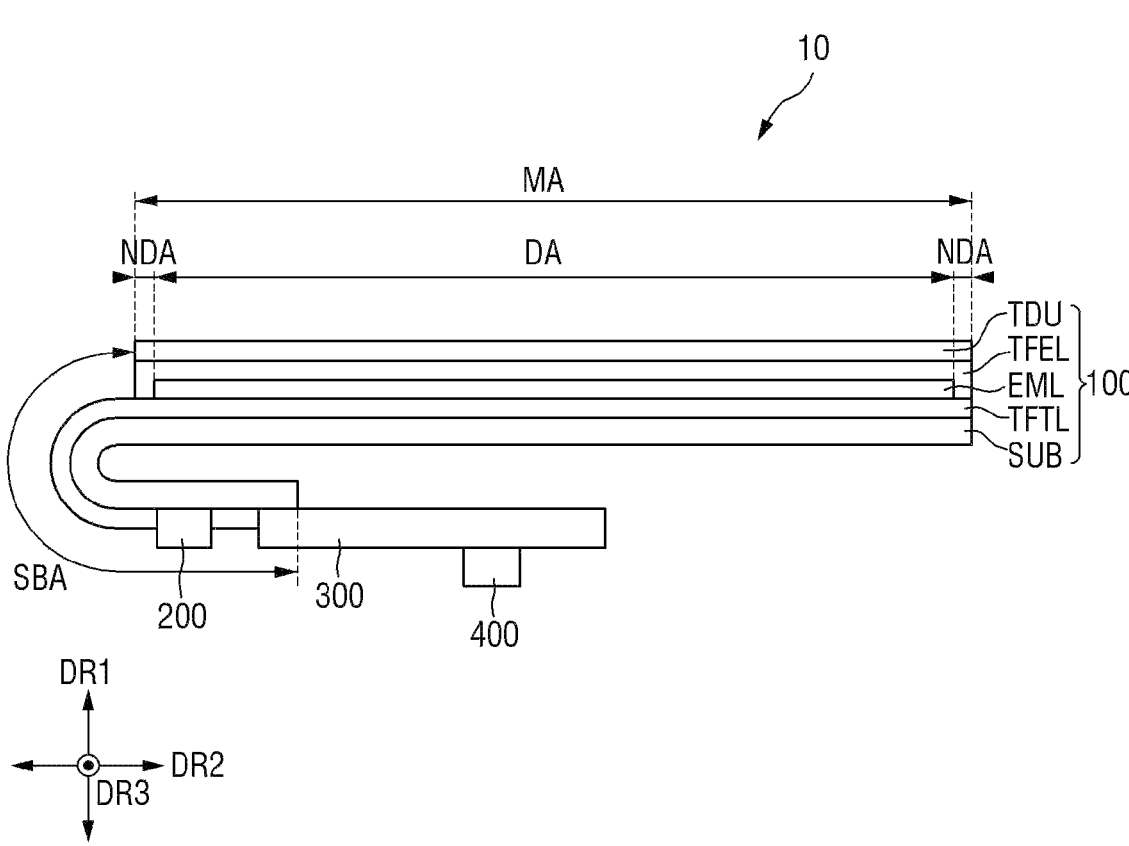
FIG. 3 is a side view of the display device according to some embodiments.

FIG. 2 is a plan view of the display device 10 according to some embodiments. FIG. 3 is a side view of the display device 10 according to some embodiments.

In FIG. 2, the sub-area SBA is unfolded without being bent. In FIG. 3, the sub-area SBA is bent toward (e.g., behind) a lower surface (e.g., a rear surface) of the display device 10.

Referring to FIGS. 2 and 3, the display panel 100 may include the main area MA and the sub-area SBA.

The main area MA may include the display area DA displaying an image and the non-display area NDA arranged around the display area DA. The display area DA may occupy most of the main area MA. The display area DA may be located in the center of the main area MA.

The display area DA may include first through sixth display areas DA1 through DA6. Each of the first display area DA1 and the fourth display area DA4 is an area in which first data lines connected to data fan-out lines through data connection lines are located. The second display area DA2 and the sixth display area DA6 may be areas in which second data lines directly connected to the data fan-out lines are located. The third display area DA3 and the fifth display area DA5 may be areas in which power holes through which first horizontal power supply lines extending in the first direction DR1 and first vertical power supply lines are connected to each other are located.

The first display area DA1 and the third display area DA3 may be located on a left side in the display area DA, and the fourth display area DA4 and the fifth display area DA5 may be located on a right side in the display area DA. The first display area DA1 may be located below the third display area DA3, and the fourth display area DA4 may be located below the fifth display area DA5. The second display area DA2 may be located between the first display area DA1 and the fourth display area DA4. The sixth display area DA6 may be located between the third display area DA3 and the fifth display area DA5.

A length of the first display area DA1 in the first direction DR1 may be substantially the same as a length of the third display area DA3 in the first direction DR1. In addition, a length of the first display area DA1 in the second direction DR2 may be smaller than a length of the third display area DA3 in the second direction DR2.

The length of the first display area DA1 in the first direction DR1 may be greater than a length of the second display area DA2 in the first direction DR1. The length of the first display area DA1 in the second direction DR2 may be substantially the same as a length of the second display area DA2 in the second direction DR2.

The length of the third display area DA3 in the first direction DR1 may be greater than the length of the second display area DA2 in the first direction DR1. The length of the third display area DA3 in the second direction DR2 may be greater than the length of the second display area DA2 in the second direction DR2.

A length of the fourth display area DA4 in the first direction DR1 may be substantially the same as a length of the fifth display area DA5 in the first direction DR1. In addition, a length of the fourth display area DA4 in the second direction DR2 may be smaller than a length of the fifth display area DA5 in the second direction DR2.

The length of the fourth display area DA4 in the first direction DR1 may be greater than the length of the second display area DA2 in the first direction DR1. The length of the fourth display area DA4 in the second direction DR2 may be substantially the same as the length of the second display area DA2 in the second direction DR2.

The length of the fifth display area DA5 in the first direction DR1 may be greater than a length of the sixth display area DA6 in the first direction DR1. The length of the fifth display area DA5 in the second direction DR2 may be substantially the same as a length of the sixth display area DA6 in the second direction DR2.

The length of the first display area DA1 in the first direction DR1 may be substantially the same as the length of the fourth display area DA4 in the first direction DR1. In addition, the length of the first display area DA1 in the second direction DR2 may be substantially the same as the length of the fourth display area DA4 in the second direction DR2.

The length of the second display area DA2 in the first direction DR1 may be substantially the same as the length of the sixth display area DA6 in the first direction DR1. In addition, the length of the second display area DA2 in the second direction DR2 may be smaller than the length of the sixth display area DA6 in the second direction DR2.

The length of the third display area DA3 in the first direction DR1 may be substantially the same as the length of the fifth display area DA5 in the first direction DR1. In addition, the length of the third display area DA3 in the second direction DR2 may be substantially the same as the length of the fifth display area DA5 in the second direction DR2.

For example, when the display area DA includes 1080× 2340 pixels, the first display area DA1 and the third display area DA3 may include 488×2340 pixels, the second display area DA2 may include 104×2340 pixels, and the fourth display area DA4 and the fifth display area DA5 may include 488×2340 pixels.

The first display area DA1 will be described in more detail later with reference to FIG. 7, the second display area DA2 will be described in more detail later with reference to FIG. 17, and the third display area DA3 will be described in more detail later with reference to FIG. 19.

The non-display area NDA may neighbor the display area DA. The non-display area NDA may be an area outside (e.g., in a periphery, or outside a footprint of) the display area DA. That is, the non-display area NDA may surround the display area DA. The non-display area NDA may be an edge or bezel area of the display panel 100.

The sub-area SBA may protrude from a side of the main area MA in the second direction DR2. A length of the sub-area SBA in the second direction DR2 may be smaller than a length of the main area MA in the second direction DR2. A length of the sub-area SBA in the first direction DR1 may be smaller than a length of the main area MA in the first direction DR1 or may be substantially the same as the length of the main area MA in the first direction DR1. The sub-area SBA may be bent and positioned under the display panel 100. In this case, the sub-area SBA may be overlapped by the main area MA in a third direction DR3.

The sub-area SBA may include a connection area CA, a pad area PA, and a bending area BA.

The connection area CA is an area protruding from a side of the main area MA in the second direction DR2. The connection area CA may be located between the non-display area NDA of the main area MA and the bending area BA in the second direction DR2.

The pad area PA is an area in which pads PD and the display driving circuit 200 are located. The display driving circuit 200 may be attached to driving pads of the pad area PA using a conductive adhesive member such as an anisotropic conductive film. The circuit board 300 may be attached to the pads PD of the pad area PA using a conductive adhesive member such as an anisotropic conductive film.

The bending area BA is a bendable area. When the bending area BA is bent, the pad area PA may be located under the connection area CA and under the main area MA. The bending area BA may be located between the connection area CA and the pad area PA in the second direction DR2.

The display panel 100 may include a thin-film transistor layer TFTL, a light emitting element layer EML, an encapsulation layer TFEL, and a touch sensing unit TDU as illustrated in FIG. 3.

The substrate SUB may include an insulating material such as polymer resin. For example, the substrate SUB may include polyimide. The substrate SUB may be a flexible substrate that can be bent, folded, rolled, etc.

The thin-film transistor layer TFTL may be located on the substrate SUB. The thin-film transistor layer TFTL may be located in the main area MA and the sub-area SBA. The thin-film transistor layer TFTL includes thin-film transistors.

The light emitting element layer EML may be located on the thin-film transistor layer TFTL. The light emitting element layer EML may be located in the display area DA of the main area MA. The light emitting element layer EML includes light emitting elements located in light emitting parts.

The encapsulation layer TFEL may be located or formed on the light emitting element layer EML. The encapsulation layer TFEL may be located or formed in the display area DA and the non-display area NDA of the main area MA. The encapsulation layer TFEL includes at least one inorganic layer and at least one organic layer for encapsulating the light emitting element layer EML.

The touch sensing unit TDU may be located on the encapsulation layer TFEL. The touch sensing unit TDU may be located in the display area DA and the non-display area NDA of the main area MA. The touch sensing unit TDU may sense a touch of a person or an object using touch electrodes.

A cover window may be located on the touch sensing unit TDU to protect an upper part of the display panel 100. The cover window may be attached onto the touch sensing unit TDU by a transparent adhesive member such as an optically clear adhesive (OCA) film or an optically clear resin (OCR). The cover window may be an inorganic material such as glass or may be an organic material such as plastic or a polymer material.

In addition, an anti-reflection member may be additionally located between the touch sensing unit TDU and the cover window to prevent a decrease in visibility of an image displayed by the display panel 100 due to external light reflected from the display panel 100. The anti-reflection member may be a polarizing film. Alternatively, the anti-reflection member may include a light blocking organic layer such as a black matrix and a color filter or may include a light blocking organic layer such as a black matrix and an anti-reflection organic layer.

A touch driving circuit 400 may be located on the circuit board 300. The touch driving circuit 400 may be formed as an integrated circuit and attached to the circuit board 300.

The touch driving circuit 400 may be electrically connected to a plurality of driving electrodes and a plurality of sensing electrodes of the touch sensing unit TDU. The touch driving circuit 400 transmits a touch driving signal to the driving electrodes and senses a touch sensing signal of each of a plurality of touch nodes, for example, the amount of charge change of mutual capacitance through the sensing electrodes. The touch driving circuit 400 may determine whether a user's touch or proximity has occurred according to the touch sensing signal of each of the touch nodes. The user's touch indicates that an object such as a user's finger or a pen directly touches a front surface of the display device 10 located on the touch sensing unit TDU. The user's proximity indicates that an object such as a user's finger or a pen is positioned (e.g., hovers) above the front surface of the display device 10.

Figure 4:
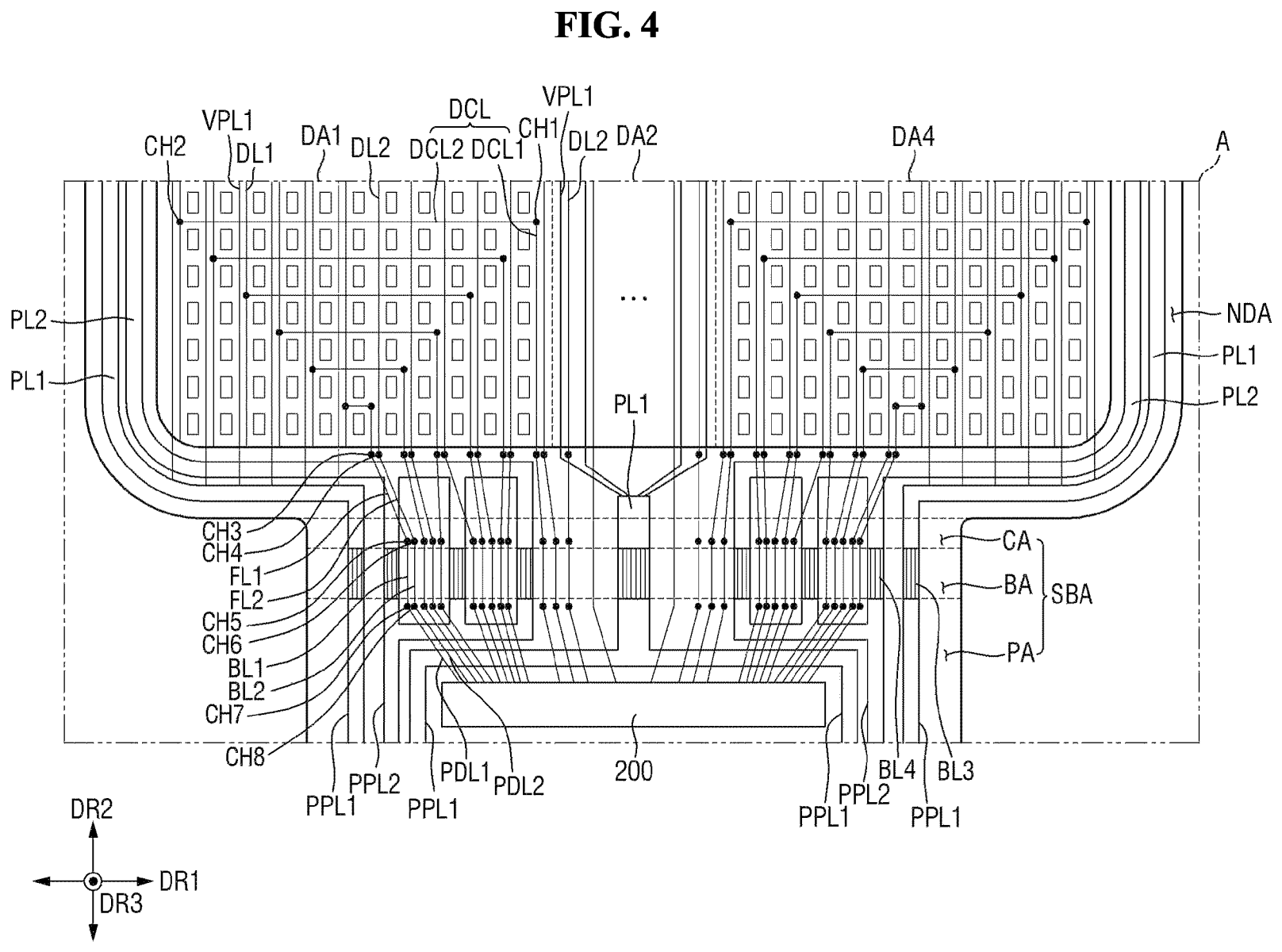

FIG. 4 is a detailed layout view of the area A of FIG. 2. In FIG. 4, the first display area DA1, the second display area DA2, the fourth display area DA4, the non-display area NDA, and the sub-area SBA are illustrated in more detail.

Referring to FIG. 4, a plurality of first data lines DL1, a plurality of second data lines DL2, a plurality of data connection lines DCL, and a plurality of first vertical power supply lines VPL1 may be located in the first display area DA1.

The first data lines DL1 may extend in the second direction DR2 and may be arranged in the first direction DR1. The second data lines DL2 may extend in the second direction DR2 and may be arranged in the first direction DR1. The data connection lines DCL may include first data connection lines DCL1 and second data connection lines DCL2. The first vertical power supply lines VPL1 may extend in the second direction DR2 and may be arranged in the first direction DR1.

Each of the first data connection lines DCL1 may extend in the second direction DR2 and may be connected to a first fan-out line FL1 through a third connection hole CH3. Each of the second data connection lines DCL2 may extend in the first direction DR1 and may be connected to a first data connection line DCL1 through a first connection hole CH1.

Each of the first data lines DL1 may be connected to a second data connection line DCL2 through a second connection hole CH2. Each of the second data lines DL2 may be connected to a second fan-out line FL2 through a fourth connection hole CH4. Each of the first vertical power supply lines VPL1 may be connected to a first power supply line PL1.

The second data lines DL2 and the first vertical power supply lines VPL1 may be located in the second display area DA2.

First fan-out lines FL1, second fan-out lines FL2, first power supply lines PL1, and second power supply lines PL2 may be located in the non-display area NDA. Each of the first fan-out lines FL1 may be connected to a first data connection line DCL1 through the third connection hole CH3. Each of the second fan-out lines FL2 may be connected to a second data line DL2 through the fourth connection hole CH4.

A first power supply line PL located in the middle among the first power supply lines PL1 may be connected to the first vertical power supply lines VPL1. First power supply lines PL1 located on the left side and the right side among the first power supply lines PL1 may surround the second power supply lines PL2. The second power supply lines PL2 may surround the display area DA. A first power supply voltage may be applied to each of the first power supply lines PL1, and a second power supply voltage higher than the first power supply voltage may be applied to each of the second power supply lines PL2.

First bending lines BL1, second bending lines BL2, third bending lines BL3, and fourth bending lines BL4 may be located in the bending area BA. Each of the first bending lines BL1 may be connected to a first fan-out line FL1 through a fifth connection hole CH5. Each of the second bending lines BL2 may be connected to a second fan-out line FL2 through a sixth connection hole CH6. Each of the third bending lines BL3 may be connected to a first power supply line PL1, and each of the fourth bending lines BL4 may be connected to a second power supply line PL2.

First pad lines PDL1, second pad lines PDL2, first power pad lines PPL1, and second power pad lines PPL2 may be located in the pad area PA. Each of the first pad lines PDL1 may be connected to a first bending line BL1 through a seventh connection hole CH7. Each of the second pad lines PDL2 may be connected to a second bending line BL2 through an eighth connection hole CH8. The first power pad lines PPL1 may be connected to the third bending lines BL3, and the second power pad lines PPL2 may be connected to the fourth bending lines BL4.

The first pad lines PDL1 and the second pad lines PDL2 may be electrically connected to the display driving circuit 200. The first power pad lines PPL1 and the second power pad lines PPL2 may be directly connected to the pads PD. The display driving circuit 200 may be connected to the pads PD through the third pad lines PDL3.

As illustrated in FIG. 4, the first data lines DL1 located on left and right sides of the display panel 100 are connected to the first fan-out lines FL1 through the data connection lines DCL. Accordingly, there is no need for the first fan-out lines FL1 to be located in the non-display area NDA on a lower side of the display panel 100 so as to be connected to the first data lines DL1 located adjacent to left and right sides of the display area DA. Therefore, even when the area of the non-display area NDA on the lower side of the display panel 100 is reduced, a space for placing the fan-out lines FL1 and FL2 may not be insufficient.

Figure 5:
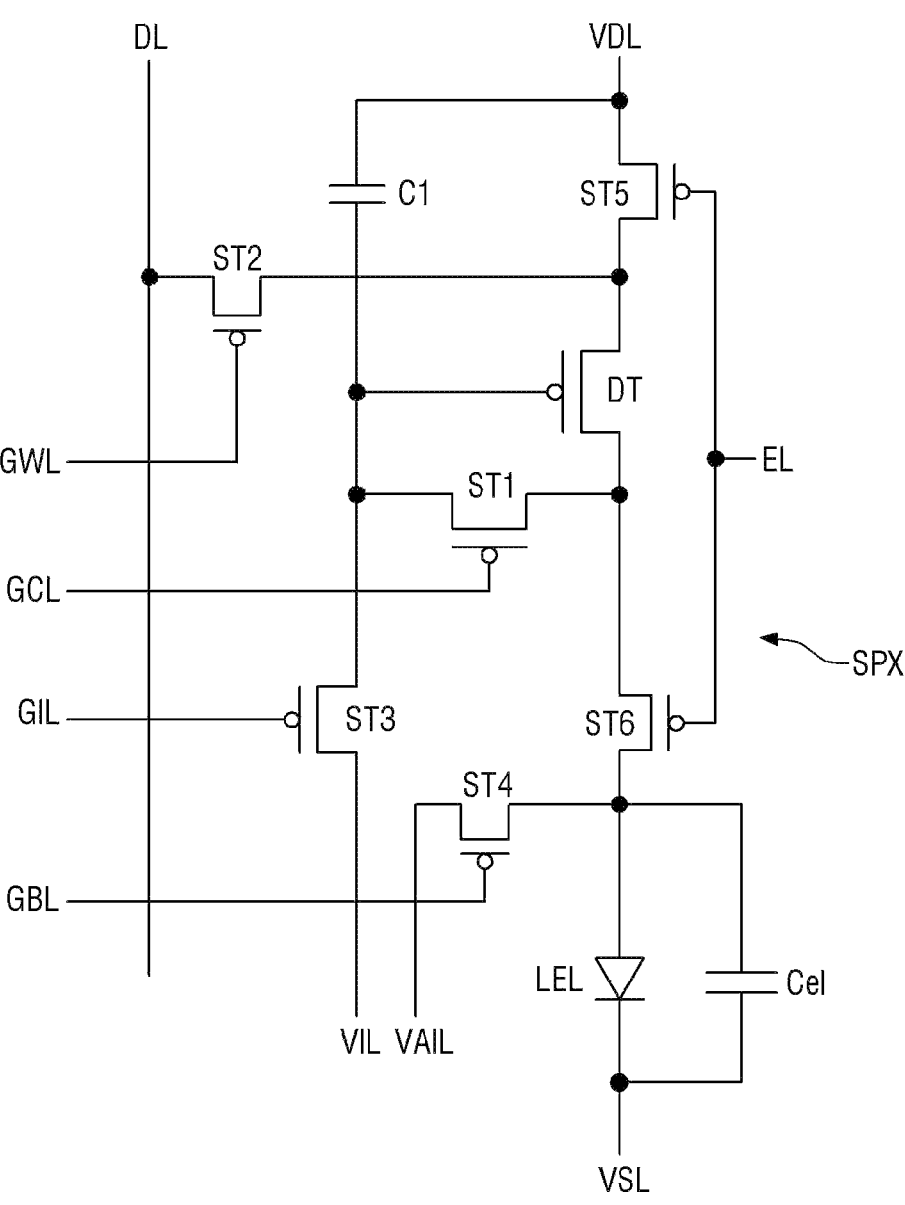
FIG. 5 is a circuit diagram of a subpixel according to some embodiments.

FIG. 5 is a circuit diagram of a subpixel SPX of a display layer according to some embodiments.

Referring to FIG. 5, the subpixel SPX may be connected to at least any one of scan lines GWL, GIL, GCL and GBL, any one of emission lines EL, and any one of data lines. For example, the subpixel SPX may be connected to a write scan line GWL, an initialization scan line GIL, a control scan line GCL, a bias scan line GBL, an emission line EL, and a data line DL.

The subpixel SPX includes a light emitting element LEL and a pixel driver PDU. The pixel driver PDU includes a driving transistor DT, switch elements, and a capacitor C1. The switch elements include first through sixth transistors ST1 through ST6.

The driving transistor DT includes a gate electrode, a first electrode, and a second electrode. The driving transistor DT controls a drain-source current Ids (hereinafter, referred to as a "driving current") flowing between the first electrode and the second electrode according to a data voltage applied to the gate electrode.

The light emitting element LEL emits light according to the driving current Ids. The amount of light emitted from the light emitting element LEL may be proportional to the driving current Ids.

The light emitting element LEL may be an organic light emitting diode including an anode, a cathode, and an organic light emitting layer located between the anode and the cathode. Alternatively, the light emitting element LEL may be an inorganic light emitting element including an anode, a cathode, and an inorganic semiconductor located between the anode and the cathode. Alternatively, the light emitting element LEL may be a quantum dot light emitting element including an anode, a cathode, and a quantum dot light emitting layer located between the anode and the cathode. Alternatively, the light emitting element LEL may be a micro-light emitting diode.

The anode of the light emitting element LEL may be connected to a first electrode of the fourth transistor ST4 and a second electrode of the sixth transistor ST6, and the cathode may be connected to a low potential line VSL. A parasitic capacitance Cel may be formed between the anode and the cathode of the light emitting element LEL.

The capacitor C1 is formed between the second electrode of the driving transistor DT and a high potential line VDL. The capacitor C1 may have one electrode connected to the second electrode of the driving transistor DT and the other electrode connected to the high potential line VDL. The high potential line VDL is electrically connected to the second power supply line PL2. Therefore, the second power supply voltage of the second power supply line PL2 is supplied to the high potential line VDL.

As illustrated in FIG. 5, the first through sixth transistors ST1 through ST6 and the driving transistor DT may all be formed as P-type metal oxide semiconductor field effect transistors (MOSFETs). An active layer of each of the first through sixth transistors ST1 through ST6 and the driving transistor DT may include polysilicon or an oxide semiconductor.

A gate electrode of the second transistor ST2 may be connected to the write scan line GWL, and a gate electrode of the first transistor ST1 may be connected to the control scan line GCL. A gate electrode of the third transistor ST3 may be connected to the initialization scan line GIL, and a gate electrode of the fourth transistor ST4 may be connected to the bias scan line GBL. Because the first through sixth transistors ST1 through ST6 are formed as P-type MOS-FETs, they may be turned on when corresponding scan signals and emission signals of a gate-low voltage are transmitted to the corresponding control scan line GCL, the initialization scan line GIL, the write scan line GWL, the bias scan line GBL, and the emission line EL, respectively.

One electrode of the third transistor ST3 may be connected to a first initialization voltage line VIL, while one electrode of the fourth transistor ST4 is connected to a second initialization voltage line VAIL. A first initialization voltage applied to the first initialization voltage line VIL and a second initialization voltage applied to the second initialization voltage line VAIL may be different voltages.

Figure 6:
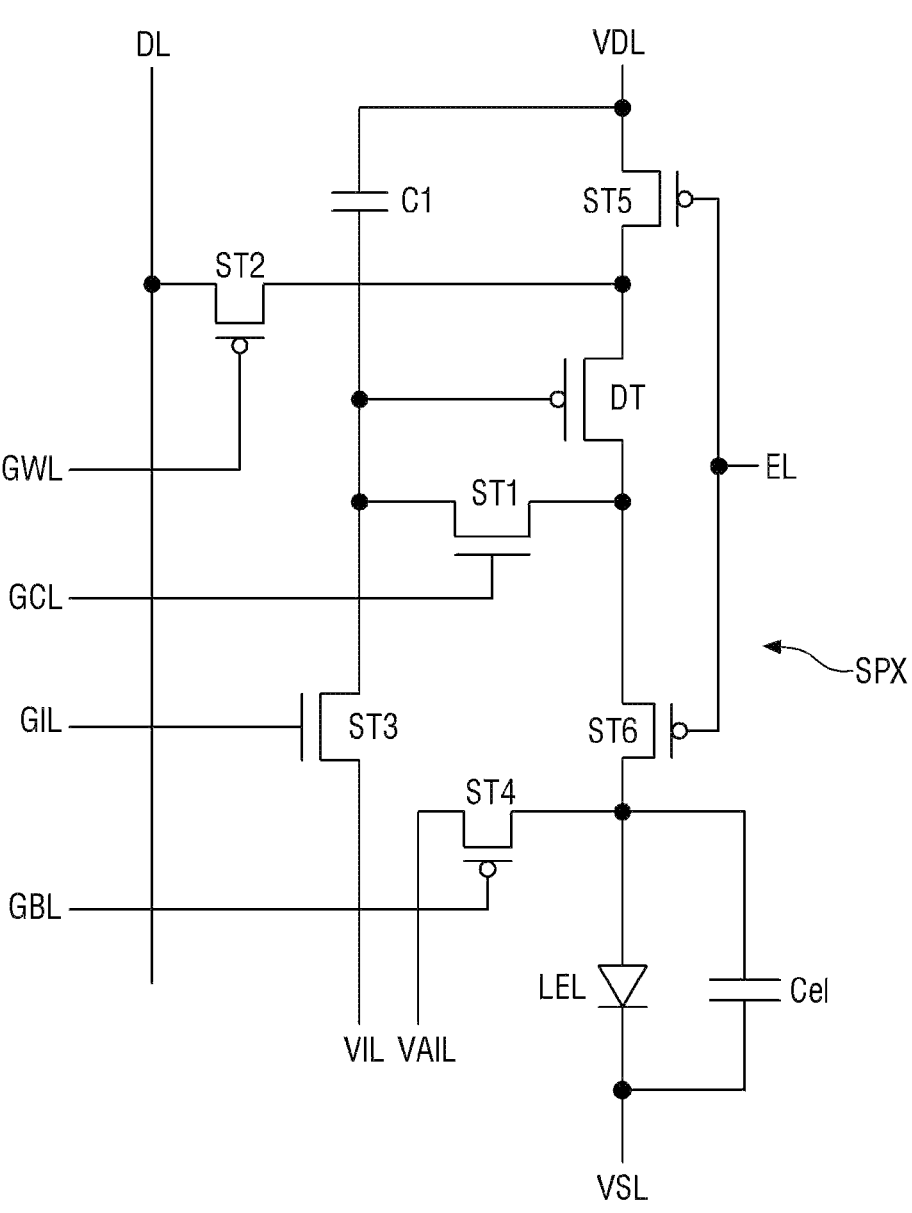
FIG. 6 is a circuit diagram of a subpixel according to some embodiments.

Alternatively, as illustrated in FIG. 6, the driving transistor DT, the second transistor ST2, the fourth transistor ST4, the fifth transistor ST5, and the sixth transistor ST6 may be formed as P-type MOSFETs, and the first transistor ST1 and the third transistor ST3 may be formed as N-type MOSFETs. The active layer of each of the driving transistor DT, the second transistor ST2, the fourth transistor ST4, the fifth transistor ST5, and the sixth transistor ST6 formed as P-type MOSFETs may include polysilicon, and the active layer of each of the first transistor ST1 and the third transistor ST3 formed as N-type MOSFETs may include an oxide semiconductor. In this case, because the transistors made of polysilicon and the transistors made of an oxide semiconductor can be located on different layers, an area in which transistors are located in each pixel PX may be reduced.

Because the first transistor ST1 and the third transistor ST3 are formed as N-type MOSFETs, the first transistor ST1 may be turned on when a control scan signal of a gate-high voltage is transmitted to the control scan line GCL, and the third transistor ST3 may be turned on when an initialization scan signal is transmitted to the initialization scan line GIL. In contrast, because the second transistor ST2, the fourth transistor ST4, the fifth transistor ST5, and the sixth transistor ST6 are formed as P-type MOSFETs, they may be turned on when a scan signal and an emission signal of a gate-low voltage and an emission signal are transmitted to the scan write line GWL and the emission line EL, respectively.

Alternatively, in FIG. 6, the fourth transistor ST4 may be formed as an N-type MOSEFT. In this case, the active layer of the fourth transistor ST4 may include an oxide semiconductor. When the fourth transistor ST4 is formed as an N-type MOSFET, it may be turned on when a bias scan signal of a gate-high voltage is transmitted to the bias scan line GBL.

Alternatively, according to some embodiments, the first through sixth transistors ST1 through ST6 and the driving transistor DT may all be formed as N-type MOSFETs.

Although aspects of some example circuits of a subpixel SPX are illustrated in FIGS. 5 and 6 according to some embodiments, embodiments according to the present disclosure are not limited to the circuit structure of the subpixel SPX as shown in FIGS. 5 and 6. For example, some embodiments may include additional components or fewer components (e.g., transistors, capacitors, etc.), without departing from the spirit and scope of embodiments according to the present disclosures.

Figure 7:
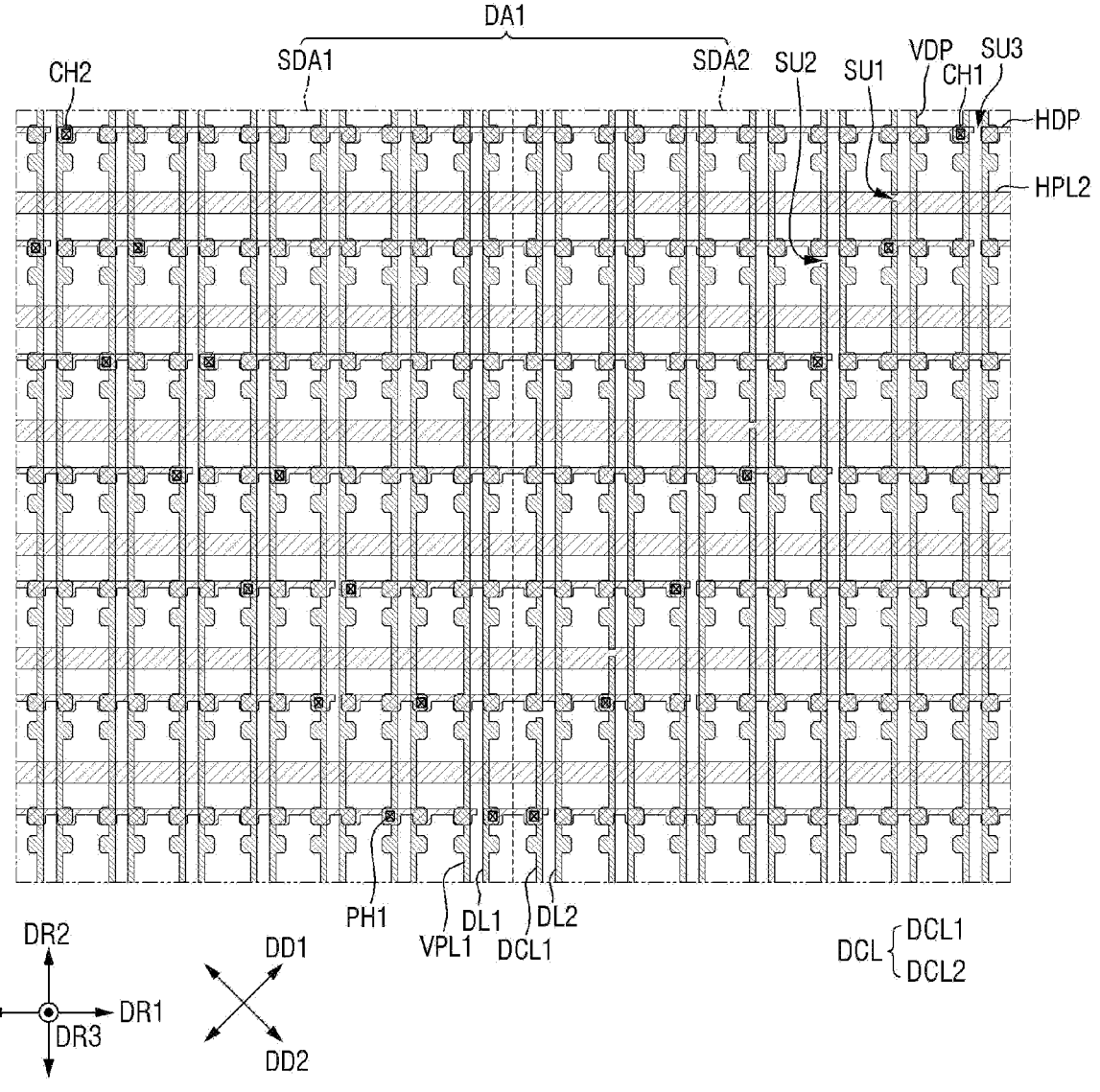
FIG. 7 is a layout view of an example of a first display area of FIG. 2 according to some embodiments.
Figure 8:
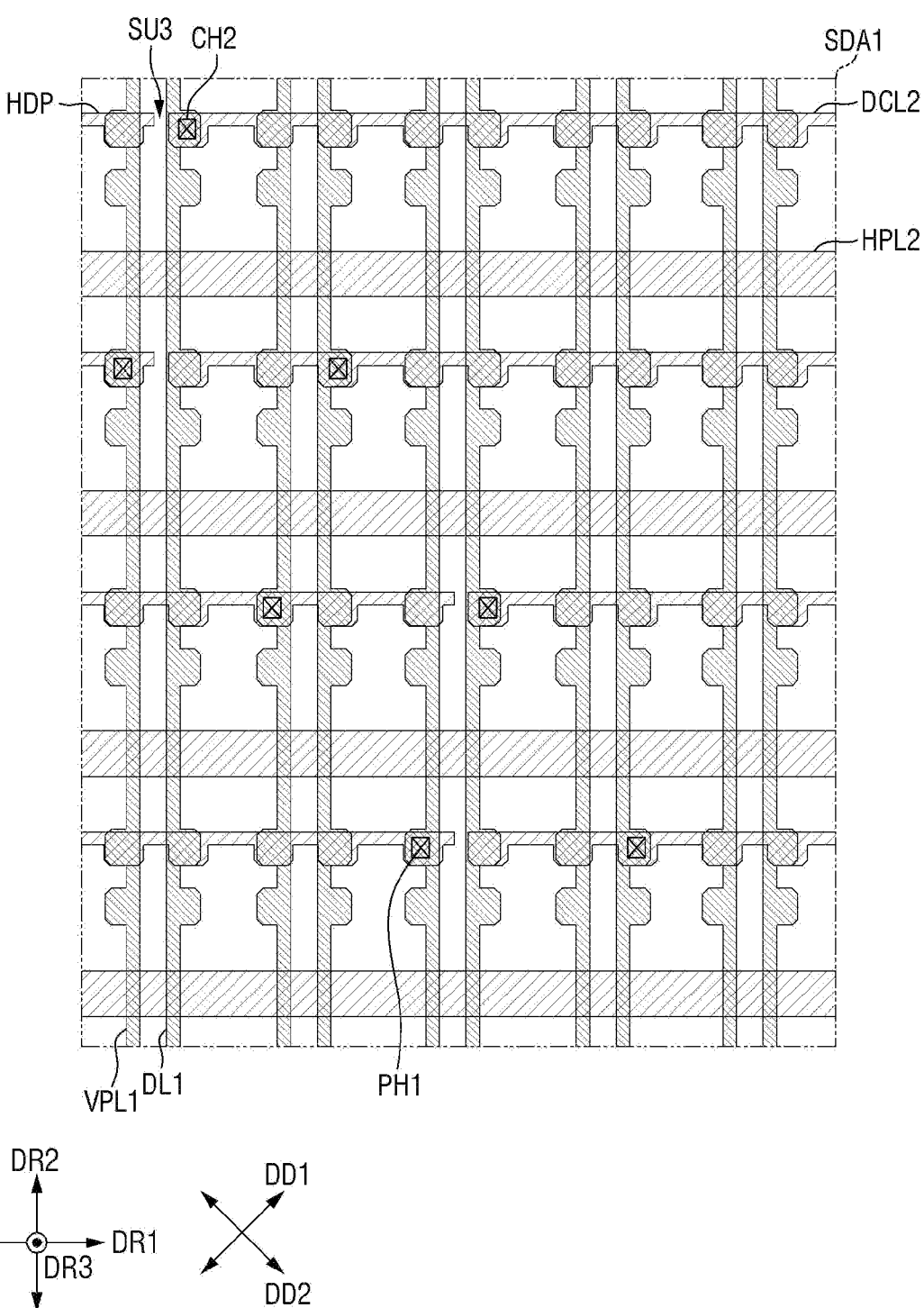
FIG. 8 is a detailed layout view of a part of a first sub-display area of FIG. 7 according to some embodiments.
Figure 9:
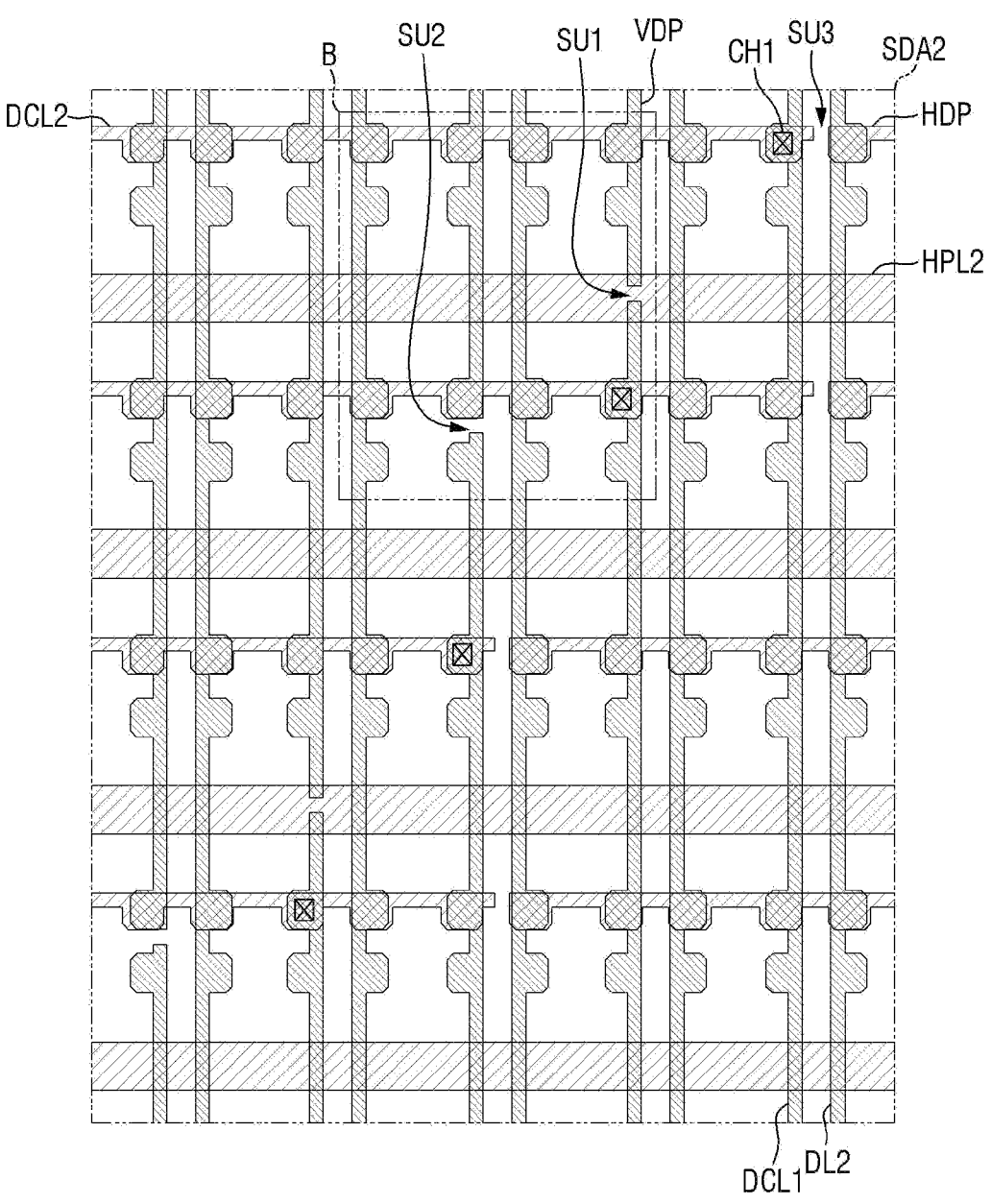
FIG. 9 is a detailed layout view of a part of a second sub-display area of FIG. 7 according to some embodiments.

FIG. 7 is a layout view of an example of the first display area DA1 of FIG. 2. FIG. 8 is a detailed layout view of a part of a first sub-display area SDA1 of FIG. 7. FIG. 9 is a detailed layout view of a part of a second sub-display area SDA2 of FIG. 7.

Referring to FIGS. 7 through 9, the first display area DA1 includes the first sub-display area SDA1 and the second sub-display area SDA2. The second sub-display area SDA2 is an area in which the first connection holes CH1 through which the first data connection lines DCL1 and the second data connection lines DCL2 are respectively connected are located. The first sub-display area SDA1 is an area in which the second connection holes CH2 through which the second data connection lines DCL2 and the first data lines DL1 are respectively connected are located.

The first data lines DL1 and the first vertical power supply lines VPL1 may be located in the first sub-display area SDA1, and the second data lines DL2, the first data connection lines DCL1 and a plurality of vertical dummy patterns VDP may be located in the second sub-display area SDA2. In addition, the second data connection lines DCL2 and a plurality of horizontal dummy patterns HDP may be located in the first sub-display area SDA1 and the second sub-display area SDA2.

In the first sub-display area SDA1, the first data lines DL1 and the first vertical power supply lines VPL1 may be alternately arranged in the first direction DR1. That is, a first vertical power supply line VPL1 may be located between the first data lines DL1 neighboring each other in the first direction DR1, and a first data line DL1 may be located between the first vertical power supply lines VPL1 neighboring each other in the first direction DR1.

In the second sub-display area SDA2, the second data lines DL2 and the first data connection lines DCL1 may be alternately arranged in the first direction DR1. That is, a first data connection line DCL1 may be located between the second data lines DL2 neighboring each other in the first direction DR1, and a second data line DL2 may be located between the first data connection lines DCL1 neighboring each other in the first direction DR1.

In addition, in the second sub-display area SDA2, the second data lines DL2 and the vertical dummy patterns VDP may be alternately arranged in the first direction DR1. That is, a vertical dummy pattern VDP may be located between the second data lines DL2 neighboring each other in the first direction DR1, and a second data line DL2 may be located between the vertical dummy patterns VDP neighboring each other in the first direction DR1.

Each of the first data lines DL1, the first vertical power supply lines VPL1, the second data lines DL2, and the first data connection lines DCL1 may include first wiring parts having a first width and second wiring parts having a second width greater than the first width. The first wiring parts and the second wiring parts may be alternately located in the second direction DR2. Some of the second wiring parts may overlap the second data connection lines DCL2 or the horizontal dummy patterns HDP, and the others may not overlap the second data connection lines DCL2 or the horizontal dummy patterns HDP.

A plurality of second horizontal power supply lines HPL2 may extend in the first direction DR1 and may be arranged in the second direction DR2. The second power supply voltage higher than the first power supply voltage may be applied to the second horizontal power supply lines HPL2. The first power supply voltage may be a low potential voltage, and the second power supply voltage may be a high potential voltage.

The second data connection lines DCL2 may extend in the first direction DR1 and may be arranged in the second direction DR2. In the first display area DA1, the second horizontal power supply lines HPL2 and the second data connection lines DCL2 may be alternately arranged in the second direction DR2. That is, a second data connection line DCL2 may be located between the second horizontal power supply lines HPL2 neighboring each other in the second direction DR2, and a second horizontal power supply line HPL2 may be located between the second data connection lines DCL2 neighboring each other in the second direction DR2.

The horizontal dummy patterns HDP may extend in the first direction DR1 and may be arranged in the second direction DR2. In the first display area DA1, the second horizontal power supply lines HPL2 and the horizontal dummy patterns HDP may be alternately arranged in the second direction DR2. That is, a horizontal dummy pattern HDP may be located between the second horizontal power supply lines HPL2 neighboring each other in the second direction DR2, and a second horizontal power supply line HPL2 may be located between the horizontal dummy patterns HDP neighboring each other in the second direction DR2.

Each of the second data connection lines DCL2 and the horizontal dummy patterns HDP may include third wiring parts having a third width and fourth wiring parts having a fourth width greater than the third width. The third wiring parts and the fourth wiring parts may be alternately arranged in the first direction DR1. Each of the fourth wiring parts may overlap a first data line DL1, a first vertical power supply line VPL1, a second data line DL2, or a first data connection line DCL1.

The first data connection lines DCL1 may be connected to the second data connection lines DCL2 through the first connection holes CH1, respectively. The first data lines DL1 may be connected to the second data connection lines DCL2 through the second connection holes CH2, respectively. The first connection holes CH1 may be arranged in a first diagonal direction DD1 in the second sub-display area SDA2. The second connection holes CH2 may be arranged in a second diagonal direction DD2 in the first sub-display area SDA1.

The first vertical power supply lines VPL1 may be connected to the horizontal dummy patterns HDP through first power holes PH1, respectively. Therefore, the first power supply voltage may be applied to each of the horizontal dummy patterns HDP. The first power holes PH1 may be arranged in the second diagonal direction DD2 in the first sub-display area SDA1.

Any one first data connection line DCL1 among the first data connection lines DCL1 and a vertical dummy pattern VDP neighboring the first data connection line DCL1 may be spaced apart from each other. A first separation portion SU1 between the first data connection line DCL1 and the vertical dummy pattern VDP neighboring the first data connection line DCL1 may overlap a second horizontal power supply line HPL2. The first separation portion SU1 will be described later with reference to FIG. 10.

In addition, another first data connection line DCL1 among the first data connection lines DCL1 and a vertical dummy pattern VDP neighboring the first data connection line DCL1 may be spaced apart from each other. A second separation portion SU2 between the first data connection line DCL1 and the vertical dummy pattern VDP neighboring the first data connection line DCL1 may not overlap a second horizontal power supply line HPL2. The second separation portion SU2 will be described later with reference to FIGS. 11 and 12.

In addition, each of the second data connection lines DCL2 and a horizontal dummy pattern HDP neighboring the second data connection line DCL2 may be spaced apart from each other. A third separation portion SU3 between each of the second data connection lines DCL2 and the horizontal dummy pattern HDP neighboring the second data connection line DCL2 may be located between a first data line DL1 and a first vertical power supply line VPL1 neighboring each other or may be located between a second data line DL2 and a first data connection line DCL1 neighboring each other.

Because the fourth display area DA4 is symmetrical to the first display area DA1 with respect to the second display area DA2, a detailed description of the fourth display area DA4 will be omitted.

Figure 10:
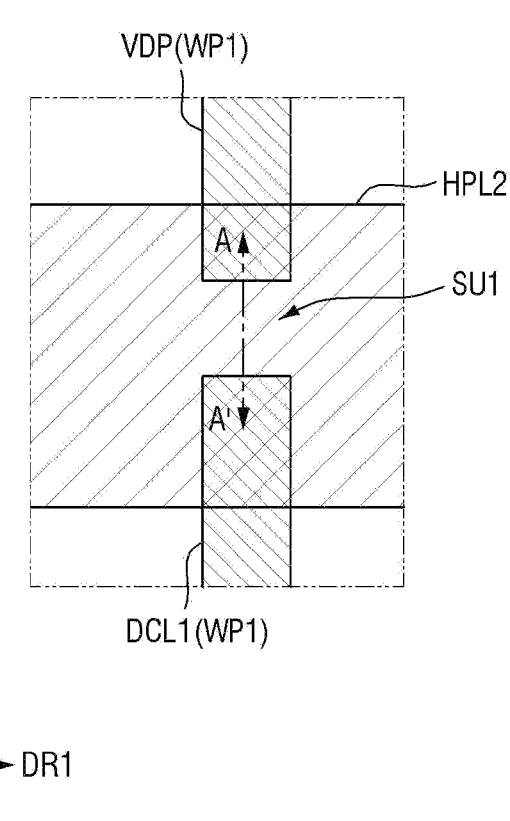
FIG. 10 is an enlarged layout view illustrating an example of a first separation portion of FIG. 9 in more detail according to some embodiments.

FIG. 10 is an enlarged layout view illustrating an example of the first separation portion SU1 of FIG. 9 in more detail.

Referring to FIG. 10, the first separation portion SU1 refers to a gap located between a first data connection line DCL1 and a neighboring vertical dummy pattern VDP and overlapping a second horizontal power supply line HPL2. The first separation portion SU1 may be a gap between a first wiring portion WP1 of the first data connection line DCL1 which has a first width Wwp1 and a first wiring portion WP1 of the vertical dummy pattern VDP which has the first width Wwp1.

A length Lsu1 of the first separation portion SU1 in the second direction DR2 may be smaller than a width Whpl2 of the second horizontal power supply line HPL2. The width Whpl2 of the second horizontal power supply line HPL2 may be a length of the second horizontal power supply line HPL2 in the second direction DR2.

Figure 11:
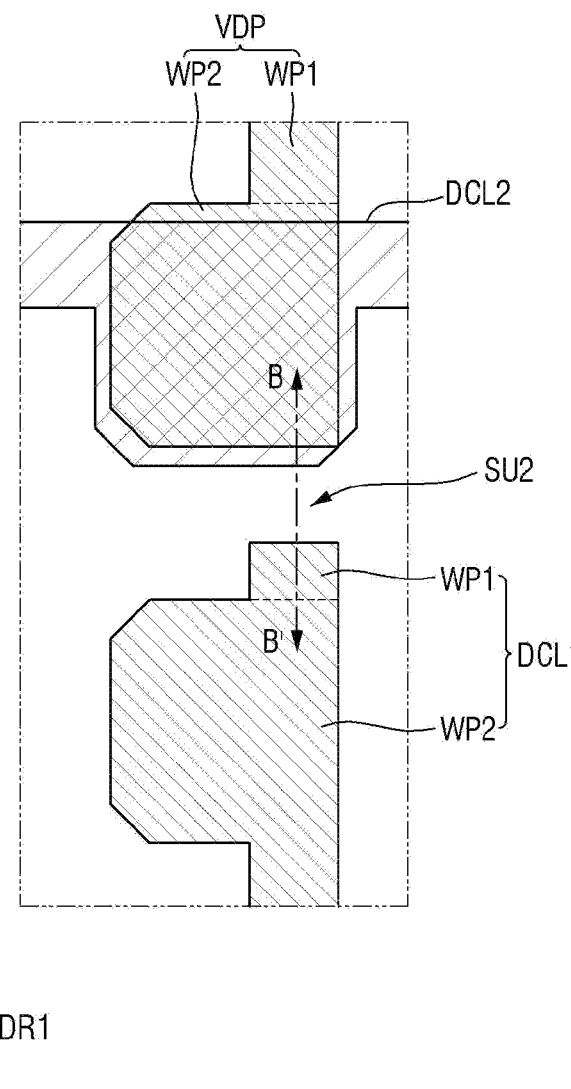
FIG. 11 is an enlarged layout view illustrating an example of a second separation portion of FIG. 9 in more detail according to some embodiments.

FIG. 11 is an enlarged layout view illustrating an example of the second separation portion SU2 of FIG. 9 in more detail.

Referring to FIG. 11, the second separation portion SU2 refers to a gap located between a first data connection line DCL1 and a neighboring vertical dummy pattern VDP and not overlapping a second horizontal power supply line HPL2. The second separation portion SU2 may be a gap between a first wiring portion WP1 of the first data connection line DCL1 which has the first width Wwp1 and a second wiring portion WP2 of the vertical dummy pattern VDP which has a second width Wwp2, but embodiments of the present specification are not limited thereto. The second separation portion SU2 may also be a gap between a second wiring portion WP2 of the first data connection line DCL1 which has the second width Wwp2 and a first wiring portion WP1 of the vertical dummy pattern VDP which has the first width Wwp1.

The second separation portion SU2 may be formed by removing a pattern connecting the first data connection line DCL1 and the vertical dummy pattern VDP through an etching process. Here, because the second wiring portion WP2 of the first data connection line DCL1 is thicker than the first wiring portion WP1, when the second separation portion SU2 is formed as a gap between the first wiring portion WP1 of the first data connection line DCL1 and the second wiring portion WP2 of the vertical dummy pattern VDP, the vertical dummy pattern VDP can be prevented from being over-etched during the etching process. In addition, Because the second wiring portion WP2 of the vertical dummy pattern VDP is also thicker than the first wiring portion WP1, when the second separation portion SU2 is formed as a gap between the second wiring portion WP2 of the first data connection line DCL1 and the first wiring portion WP1 of the vertical dummy pattern VDP, the vertical dummy pattern VDP can be prevented from being over-etched than during the etching process.

Figure 12:
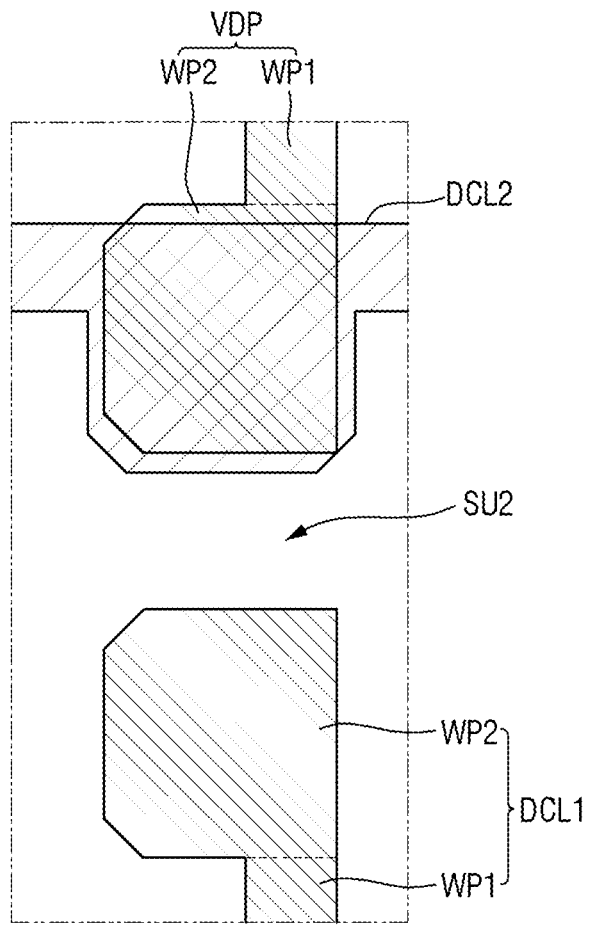
FIG. 12 is an enlarged layout view illustrating an example of the second separation portion of FIG. 9 in more detail according to some embodiments.
Figure 12:
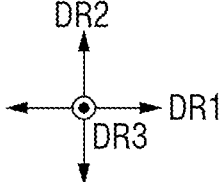

FIG. 12 is an enlarged layout view illustrating an example of the second separation portion SU2 of FIG. 9 in more detail.

The second separation portion SU2 illustrated in FIG. 12 is different from that of the embodiments of FIG. 11 in that it is a gap between a second wiring portion WP2 of a first data connection line DCL1 which has the second width Wwp2 and a second wiring portion WP2 of a vertical dummy pattern VDP which has the second width Wwp2.

The second separation portion SU2 may be formed by removing a pattern connecting the first data connection line DCL1 and the vertical dummy pattern VDP through an etching process. According to some embodiments, because the second wiring portion WP2 of the first data connection line DCL1 is thicker than a first wiring portion WP1 and the second wiring portion WP2 of the vertical dummy pattern VDP is also thicker than a first wiring portion WP1, when the second separation portion SU2 is formed as a gap between the second wiring portion WP2 of the first data connection line DCL1 and the second wiring portion WP2 of the vertical dummy pattern VDP, the vertical dummy pattern VDP and the first data connection line DCL1 can be easily prevented from being over-etched during the etching process.

Figure 13:
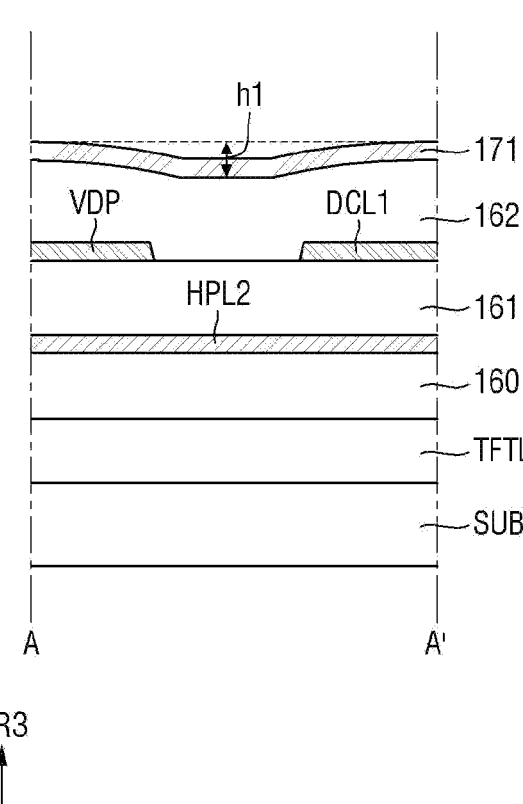
FIG. 13 is a cross-sectional view of an example of a display panel taken along the line A-A' of FIG. 10 according to some embodiments.
Figure 14:
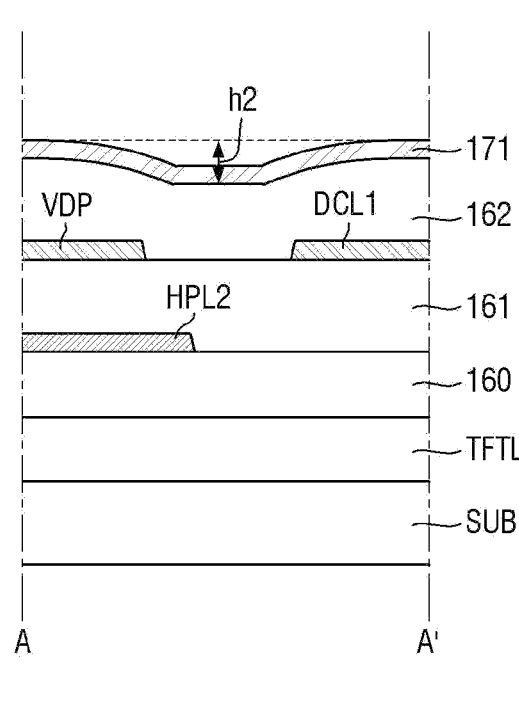
FIG. 14 is a cross-sectional view of a first comparative example of the display panel according to some embodiments.
Figure 15:
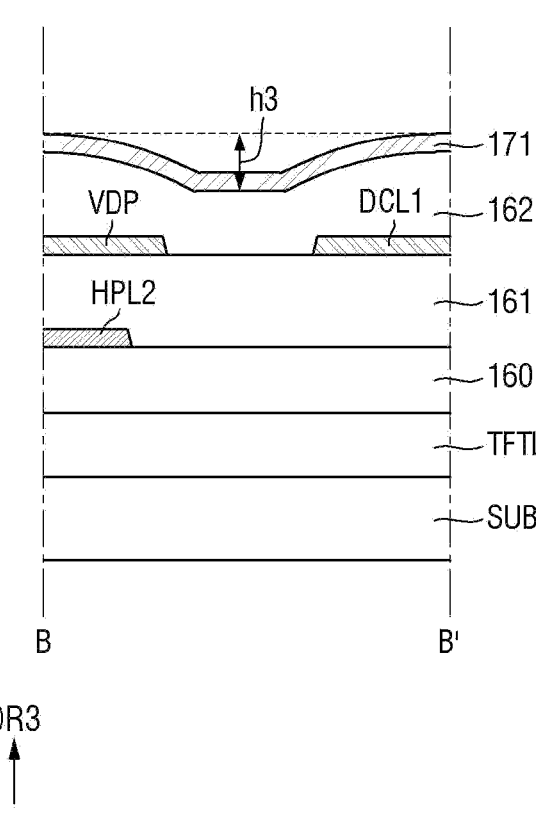
FIG. 15 is a cross-sectional view of a second comparative example of the display panel according to some embodiments.
Figure 16:
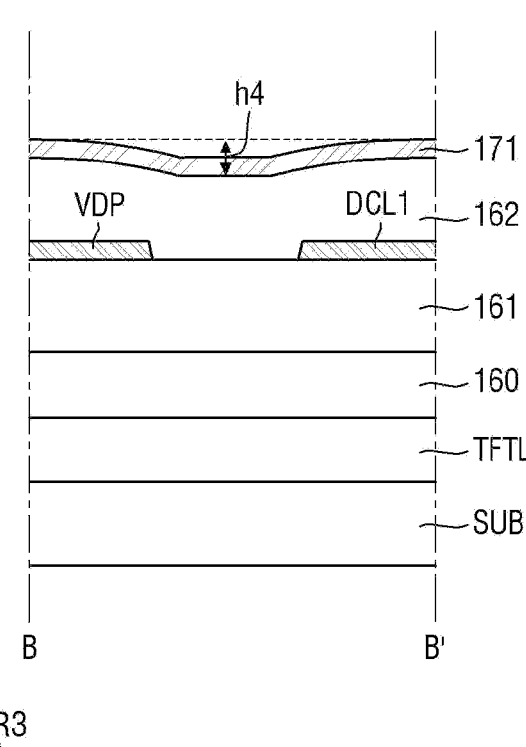
FIG. 16 is a cross-sectional view of an example of the display panel taken along the line B-B' of FIG. 11 according to some embodiments.

FIG. 13 is a cross-sectional view of an example of the display panel 100 taken along the line A-A' of FIG. 10. FIG. 14 is a cross-sectional view of a first comparative example of the display panel 100. FIG. 15 is a cross-sectional view of a second comparative example of the display panel 100. FIG. 16 is a cross-sectional view of an example of the display panel 100 taken along the line B-B' of FIG. 11.

Referring to FIGS. 13 through 15, the thin-film transistor layer TFTL may be located on the substrate SUB, a first planarization layer 160 may be located on the thin-film transistor layer TFTL, and a second horizontal power supply line HPL2 may be located on the first planarization layer 160. A second planarization layer 161 may be located on the second horizontal power supply line HPL2, and a first data connection line DCL1 and a vertical dummy pattern VDP may be located on the second planarization layer 161. A third planarization layer 162 may be located on the first data connection line DCL1 and the vertical dummy pattern VDP, and a pixel electrode 171 may be located on the third planarization layer 162.

Here, the flatness of the third planarization layer 162 may be affected by a step of the second horizontal power supply line HPL2 and a step of the first data connection line DCL1 and the vertical dummy pattern VDP. Therefore, the pixel electrode 171 located on the first separation portion SU1 may also have a step.

As illustrated in FIG. 13, when the second horizontal power supply line HPL2 overlaps the first separation portion SU1, the pixel electrode 171 may have a first step h1. In contrast, as illustrated in FIG. 14, when the second horizontal power supply line HPL2 partially overlaps the first separation portion SU1, the pixel electrode 171 may have a second step h2 greater than the first step h1. In addition, as illustrated in FIG. 15, when the second horizontal power supply line HPL2 does not overlap the first separation portion SU1 but is located adjacent to the first separation portion SU1, the pixel electrode 171 may have a third step h3 greater than the second step h2.

As illustrated in FIG. 16, when the second horizontal power supply line HPL2 does not overlap the first separation portion SU1, the pixel electrode 171 may have a fourth step h4. The fourth step h4 may be smaller than the second step h2 or the third step h3.

As the pixel electrode 171 has a greater step, a pattern due to the step of the pixel electrode 171 may be recognized by a user when external light is reflected from the display panel 100. The first separation portion SU1 may be arranged to overlap the second horizontal power supply line HPL2 as illustrated in FIG. 13, or the second separation portion SU2 may be arranged to not overlap the second horizontal power supply line HPL2 as illustrated in FIG. 16, so that the pattern due to the step of the pixel electrode 171 can be prevented from being recognized by a user.

Figure 17:
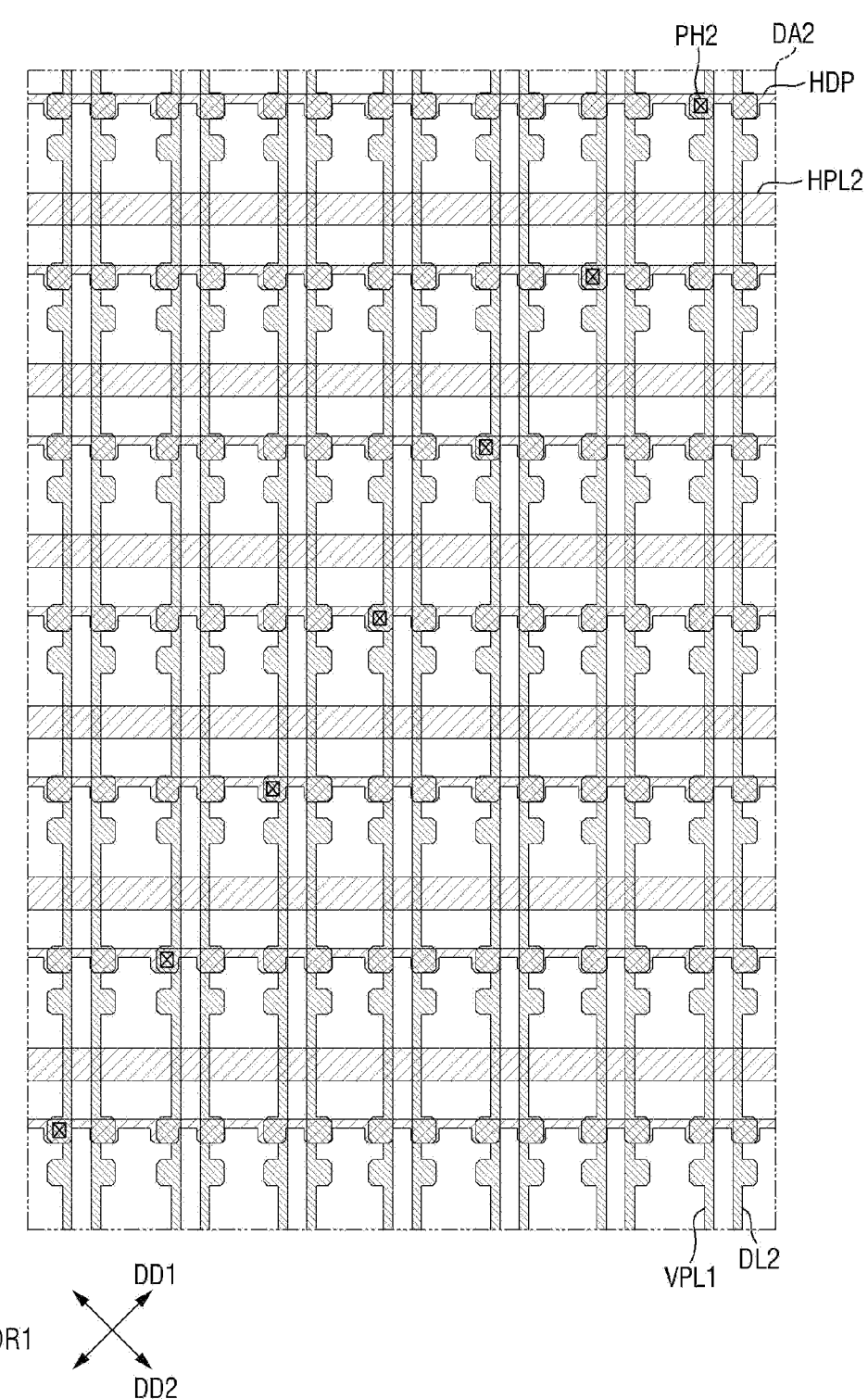
FIG. 17 is a detailed layout view of an example of a second display area of FIG. 2 according to some embodiments.
Figure 18:
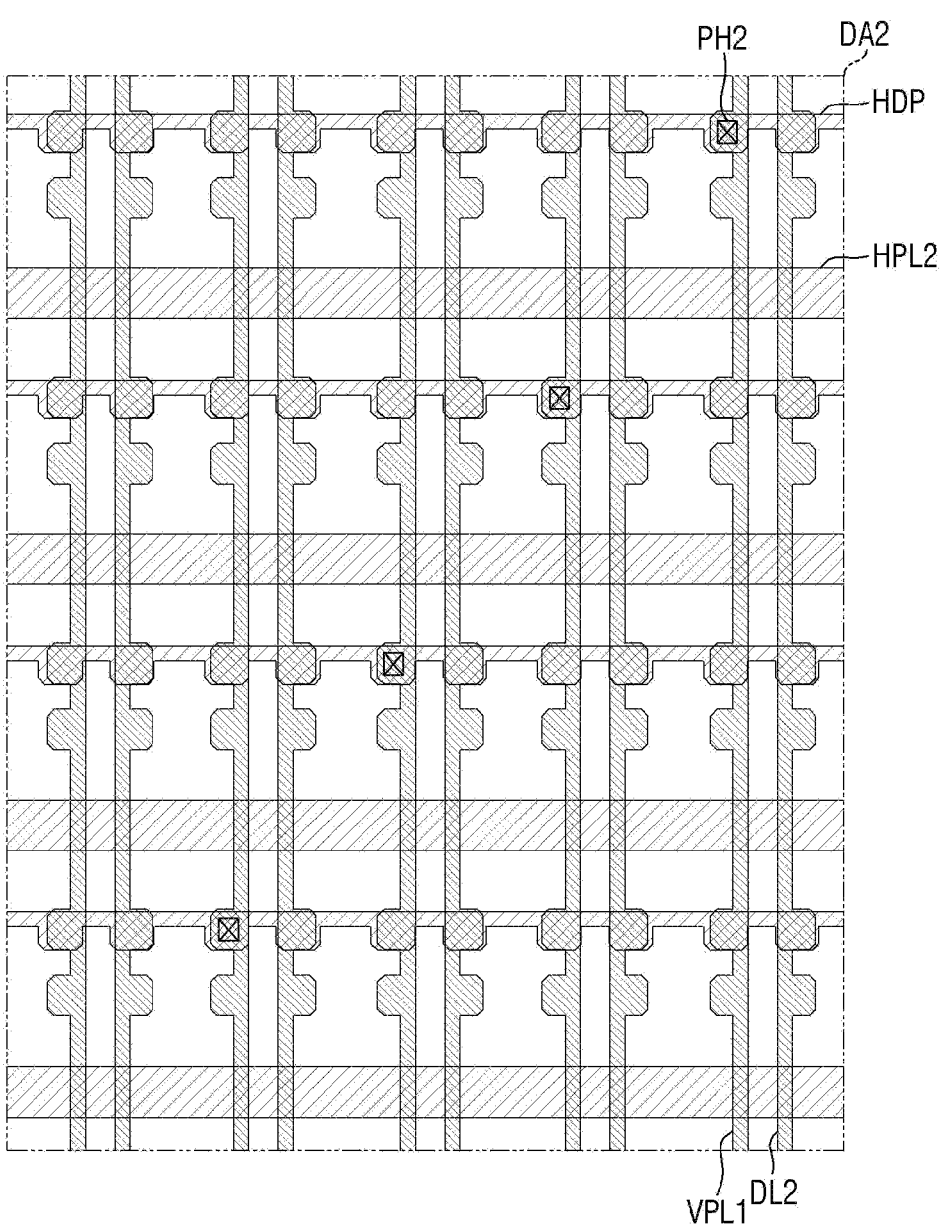
FIG. 18 is a detailed layout view of a part of the second display area of FIG. 17 according to some embodiments.

FIG. 17 is a detailed layout view of an example of the second display area DA2 of FIG. 2. FIG. 18 is a detailed layout view of a part of the second display area DA2 of FIG. 17.

Referring to FIGS. 17 and 18, the second display area DA2 is an area in which the first vertical power supply lines VPL1 are connected to the horizontal dummy patterns HDP through second power holes PH2.

The second data lines DL2 and the first vertical power supply lines VPL1 may be alternately located in the first direction DR1. That is, a first vertical power supply line VPL1 may be located between the second data lines DL2 neighboring each other in the first direction DR1, and a second data line DL2 may be located between the first vertical power supply lines VPL1 neighboring each other in the first direction DR1.

Each of the second data lines DL2 and the first vertical power supply lines VPL1 may include first wiring parts having a first width W1 and second wiring parts having a second width W2 greater than the first width W1. The first wiring parts and the second wiring parts may be alternately arranged in the second direction DR2. Some of the second wiring parts may overlap the horizontal dummy patterns HDP, and the others may not overlap the horizontal dummy patterns HDP.

The second horizontal power supply lines HPL2 may extend in the first direction DR1 and may be arranged in the second direction DR2. The second power supply voltage may be applied to the second horizontal power supply lines HPL2.

The horizontal dummy patterns HDP may extend in the first direction DR1 and may be arranged in the second direction DR2. In the second display area DA2, the second horizontal power supply lines HPL2 and the horizontal dummy patterns HDP may be alternately arranged in the second direction DR2. That is, a horizontal dummy pattern HDP may be located between the second horizontal power supply lines HPL2 neighboring each other in the second direction DR2, and a second horizontal power supply line HPL2 may be located between the horizontal dummy patterns HDP neighboring each other in the second direction DR2.

Each of the horizontal dummy patterns HDP may include third wiring parts having a third width and fourth wiring parts having a fourth width greater than the third width. The third width may be substantially the same as the first width Wwp1, and the fourth width may be substantially the same as the second width Wwp2. The third wiring parts and the fourth wiring parts may be alternately arranged in the first direction DR1. Each of the fourth wiring parts may overlap a second data line DL2 or a first vertical power supply line VPL1.

The first vertical power supply lines VPL1 may be connected to the horizontal dummy patterns HDP through the second power holes PH2, respectively. Although the second power holes PH2 are arranged in the first diagonal direction DD1 in FIG. 17, embodiments of the present specification are not limited thereto. For example, the second power holes PH2 may also be arranged in the second diagonal direction DD2. Alternatively, the second power holes PH2 may be arranged in the first diagonal direction DD1 and then in the second diagonal direction DD2. That is, the second power holes PH2 may be arranged in a ">" shape. Alternatively, the second power holes PH2 may be arranged in the second diagonal direction DD2 and then in the first diagonal direction DD1. That is, the second power holes PH2 may be arranged in a "<" shape. Alternatively, the second power holes PH2 may be arranged in a repeated pattern other than ">" and "<".

Figure 19:
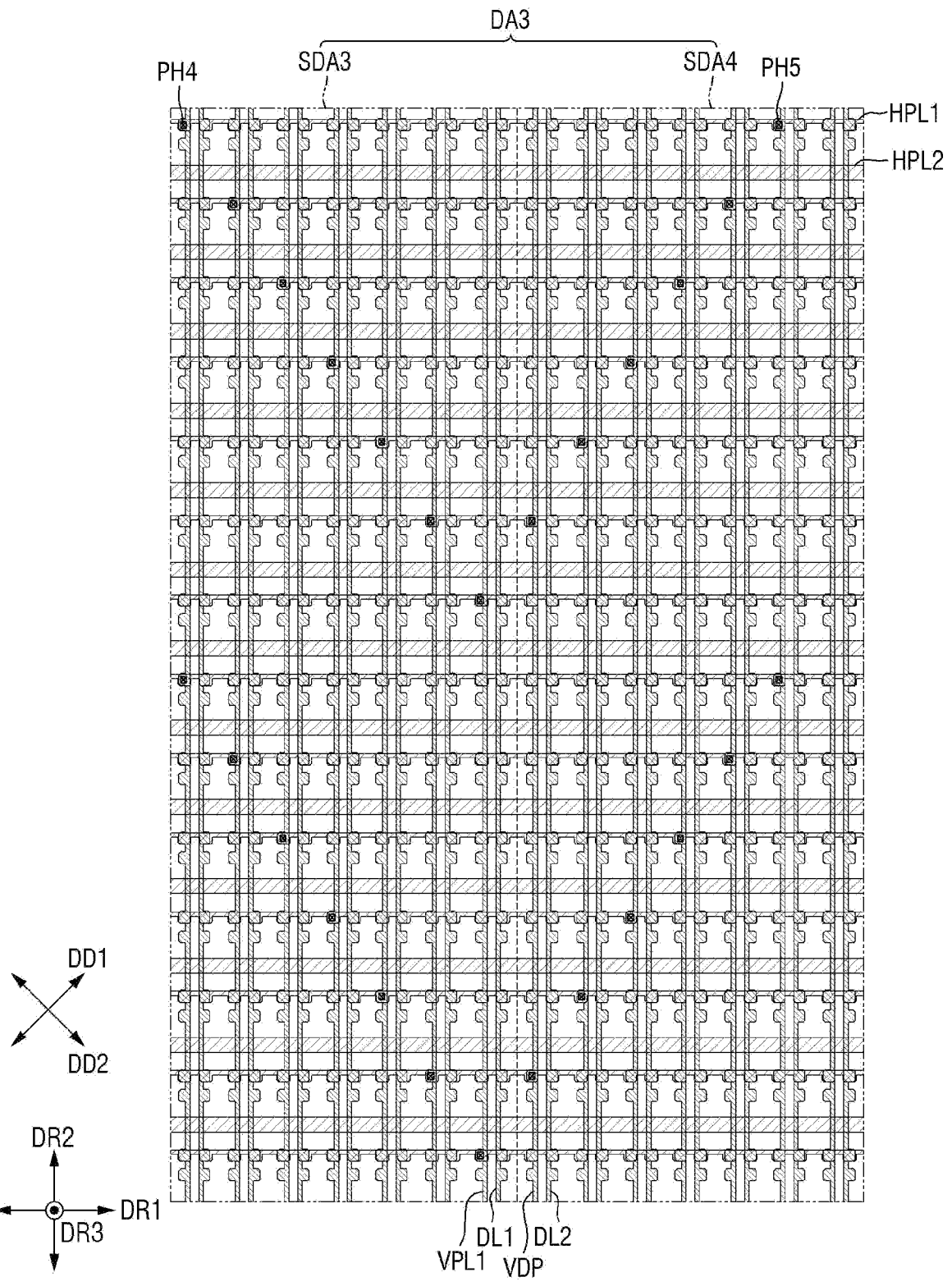
FIG. 19 is a layout view of an example of a third display area of FIG. 2 according to some embodiments.
Figure 20:
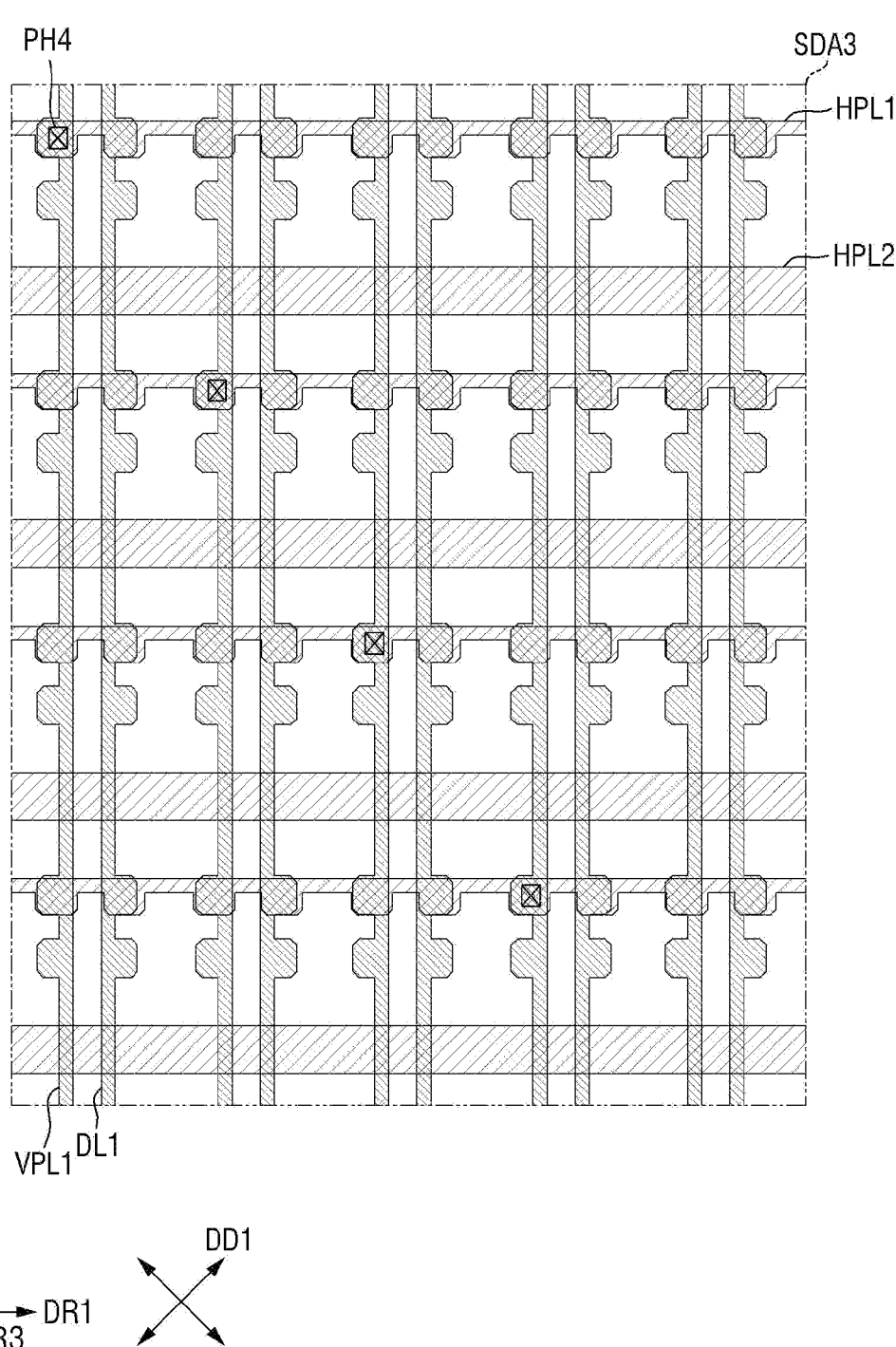
FIG. 20 is a detailed layout view of a part of a third sub-display area of FIG. 19 according to some embodiments.
Figure 21:
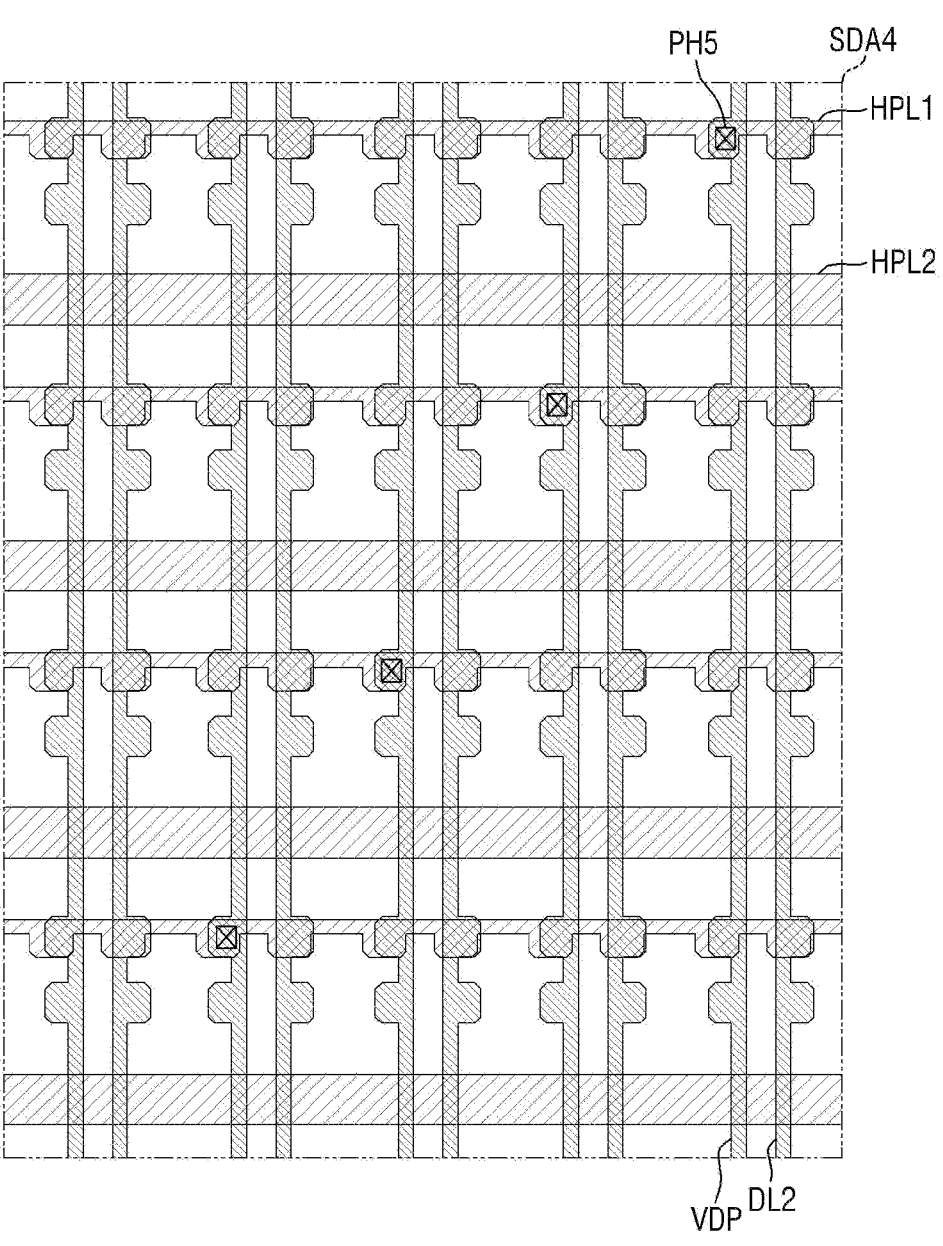
FIG. 21 is a detailed layout view of a part of a fourth sub-display area of FIG. 19 according to some embodiments.

FIG. 19 is a layout view of an example of the third display area DA3 of FIG. 2. FIG. 20 is a detailed layout view of a part of a third sub-display area SDA3 of FIG. 19. FIG. 21 is a detailed layout view of a part of a fourth sub-display area SDA4 of FIG. 19.

Referring to FIGS. 19 through 21, the third display area DA3 includes the third sub-display area SDA3 and the fourth sub-display area SDA4. The third sub-display area SDA3 is an area in which fourth power holes PH4 through which first horizontal power supply lines HPL1 and the first vertical power supply lines VPL1 are respectively connected are located. The fourth sub-display area SDA4 is an area in which fifth power holes PH5 through which the first horizontal power supply lines HPL1 and the vertical dummy patterns VDP are respectively connected are located.

The first data lines DL1 and the first vertical power supply lines VPL1 may be located in the third sub-display area SDA3, and the second data lines DL2 and the vertical dummy patterns VDP may be located in the fourth sub-display area SDA4.

In the third sub-display area SDA3, the first data lines DL1 and the first vertical power supply lines VPL1 may be alternately arranged in the first direction DR1. That is, a first vertical power supply line VPL1 may be located between the first data lines DL1 neighboring each other in the first direction DR1, and a first data line DL1 may be located between the first vertical power supply lines VPL1 neighboring each other in the first direction DR1.

In the fourth sub-display area SDA4, the second data lines DL2 and the vertical dummy patterns VDP may be alternately arranged in the first direction DR1. That is, a vertical dummy pattern VDP may be located between the second data lines DL2 neighboring each other in the first direction DR1, and a second data line DL2 may be located between the vertical dummy patterns VDP neighboring each other in the first direction DR1.

Each of the first data lines DL1, the first vertical power supply lines VPL1, and the second data lines DL2 may include first wiring parts having the first width W1 and second wiring parts having the second width W2 greater than the first width W1. The first wiring parts and the second wiring parts may be alternately arranged in the second direction DR2. Some of the second wiring parts may overlap the first horizontal power supply lines HPL1, and the others may not overlap the first horizontal power supply lines HPL1.

The second horizontal power supply lines HPL2 may extend in the first direction DR1 and may be arranged in the second direction DR2. The second power supply voltage may be applied to the second horizontal power supply lines HPL2.

Each of the first horizontal power supply lines HPL1 may include third wiring parts having a third width W3 and fourth wiring parts having a fourth width W4 greater than the third width W3. The third wiring parts and the fourth wiring parts may be alternately arranged in the first direction DR1. Each of the fourth wiring parts may overlap a first data line DL1, a first vertical power supply line VPL1, or a second data line DL2.

The first vertical power supply lines VPL1 may be connected to the first horizontal power supply lines HPL1 through the fourth power holes PH4, respectively. The vertical dummy patterns VDP may be connected to the first horizontal power supply lines HPL1 through the fifth power holes PH5, respectively.

In FIG. 19, the fourth power holes PH4 are arranged in the second diagonal direction DD2, and the fifth power holes PH5 are arranged in the first diagonal direction DD1. Therefore, the fourth power holes PH4 and the fifth power holes PH5 are repeatedly arranged in a "v" shape. However, embodiments of the present specification are not limited thereto. For example, the fourth power holes PH4 may also be arranged in the first diagonal direction DD1, and the fifth power holes PH5 may also be arranged in the second diagonal direction DD2 so that the fourth power holes PH4 and the fifth power holes PH5 are repeatedly arranged in a "∧" shape. Alternatively, the fourth power holes PH4 and the fifth power holes PH5 may be arranged in a repeated pattern other than "∨" and "∧".

Because the fifth display area DA5 is symmetrical to the third display area DA3 with respect to the sixth display area DA6, a detailed description of the fifth display area DA5 will be omitted.

Figure 22:
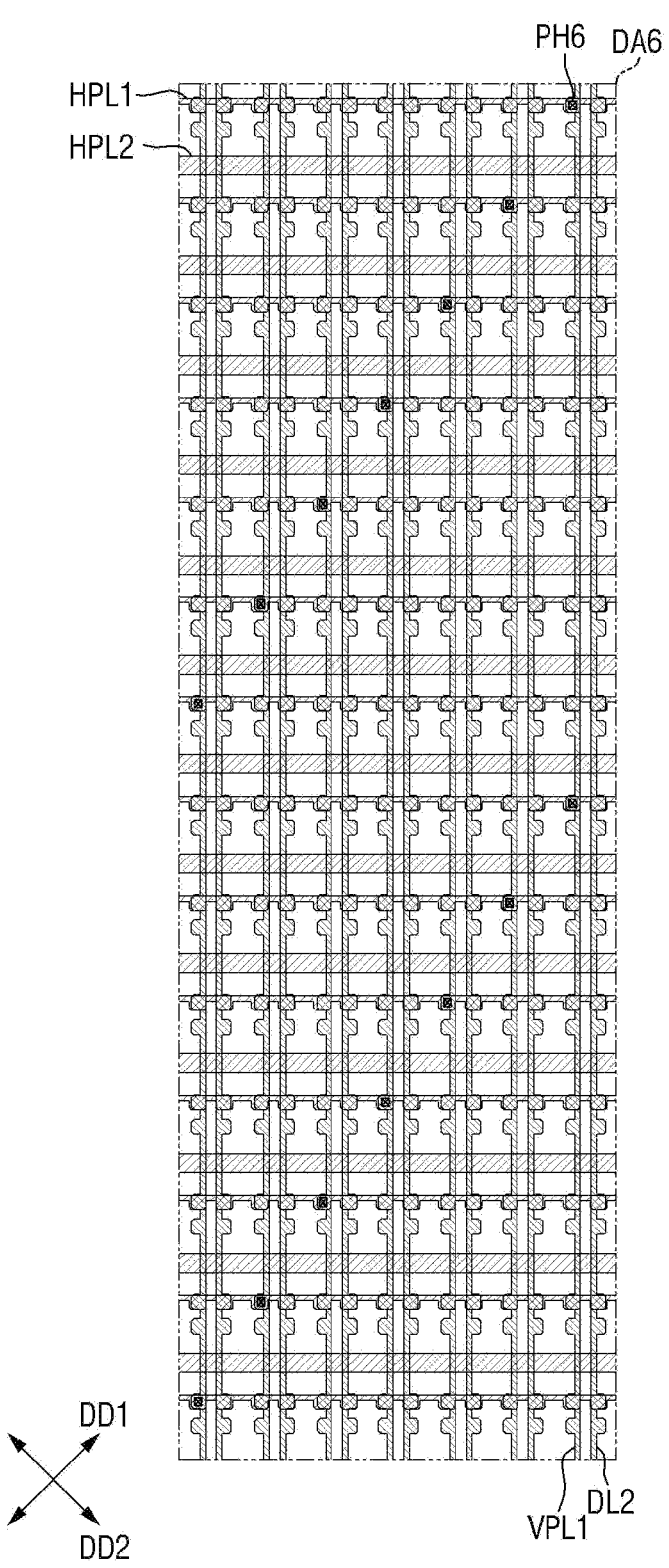
FIG. 22 is a detailed layout view of an example of a sixth display area of FIG. 2 according to some embodiments.
Figure 23:
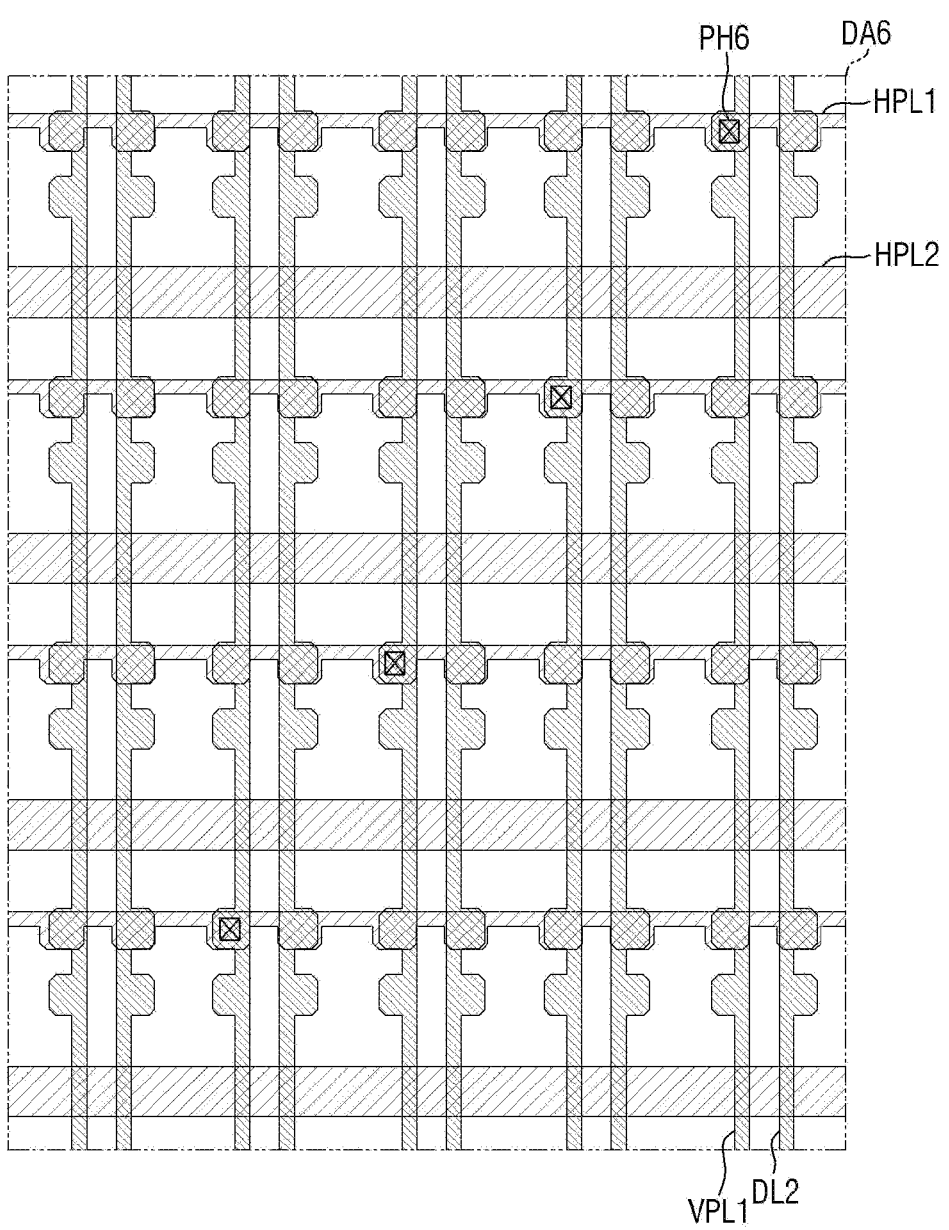
FIG. 23 is a detailed layout view of a part of the sixth display area of FIG. 22 according to some embodiments.

FIG. 22 is a detailed layout view of an example of the sixth display area DA6 of FIG. 2. FIG. 23 is a detailed layout view of a part of the sixth display area DA6 of FIG. 22.

Referring to FIGS. 22 and 23, the sixth display area DA6 is an area in which the first vertical power supply lines VPL1 are connected to the first horizontal power supply lines HPL1 through sixth power holes PH6.

The second data lines DL2 and the first vertical power supply lines VPL1 may be alternately arranged in the first direction DR1. That is, a first vertical power supply line VPL1 may be located between the second data lines DL2 neighboring each other in the first direction DR1, and a second data line DL2 may be located between the first vertical power supply lines VPL1 neighboring each other in the first direction DR1.

Each of the second data lines DL2 and the first vertical power supply lines VPL1 may include first wiring parts having the first width W1 and second wiring parts having the second width W2 greater than the first width W1. The first wiring parts and the second wiring parts may be alternately arranged in the second direction DR2. Some of the second wiring parts may overlap the first vertical power supply lines VPL1, and the others may not overlap the first vertical power supply lines VPL1.

The second horizontal power supply lines HPL2 may extend in the first direction DR1 and may be arranged in the second direction DR2. The second power supply voltage may be applied to the second horizontal power supply lines HPL2.

The first horizontal power supply lines HPL1 may extend in the first direction DR1 and may be arranged in the second direction DR2. In the sixth display area DA6, the second horizontal power supply lines HPL2 and the first horizontal power supply lines HPL1 may be alternately arranged in the second direction DR2. That is, a first horizontal power supply line HPL1 may be located between the second horizontal power supply lines HPL2 neighboring each other in the second direction DR2, and a second horizontal power supply line HPL2 may be located between the first horizontal power supply lines HPL1 neighboring each other in the second direction DR2.

Each of the first horizontal power supply lines HPL1 may include third wiring parts having the third width W3 and fourth wiring parts having the fourth width W4 greater than the third width W3. The third wiring parts and the fourth wiring parts may be alternately arranged in the first direction DR1. Each of the fourth wiring parts may overlap a second data line DL2 or a first vertical power supply line VPL1.

The first vertical power supply lines VPL1 may be connected to the first horizontal power supply lines HPL1 through the sixth power holes PH6, respectively. Although the sixth power holes PH6 are arranged in the first diagonal direction DD1 in FIG. 22, embodiments of the present specification are not limited thereto. For example, the sixth power holes PH6 may also be arranged in the second diagonal direction DD2. Alternatively, the sixth power holes PH6 may be arranged in the first diagonal direction DD1 and then in the second diagonal direction DD2. That is, the sixth power holes PH6 may be arranged in a ">" shape. Alternatively, the sixth power holes PH6 may be arranged in the second diagonal direction DD2 and then in the first diagonal direction DD1. That is, the sixth power holes PH6 may be arranged in a "<" shape. Alternatively, the sixth power holes PH6 may be arranged in a repeated pattern other than ">" and "<".

Figure 24:
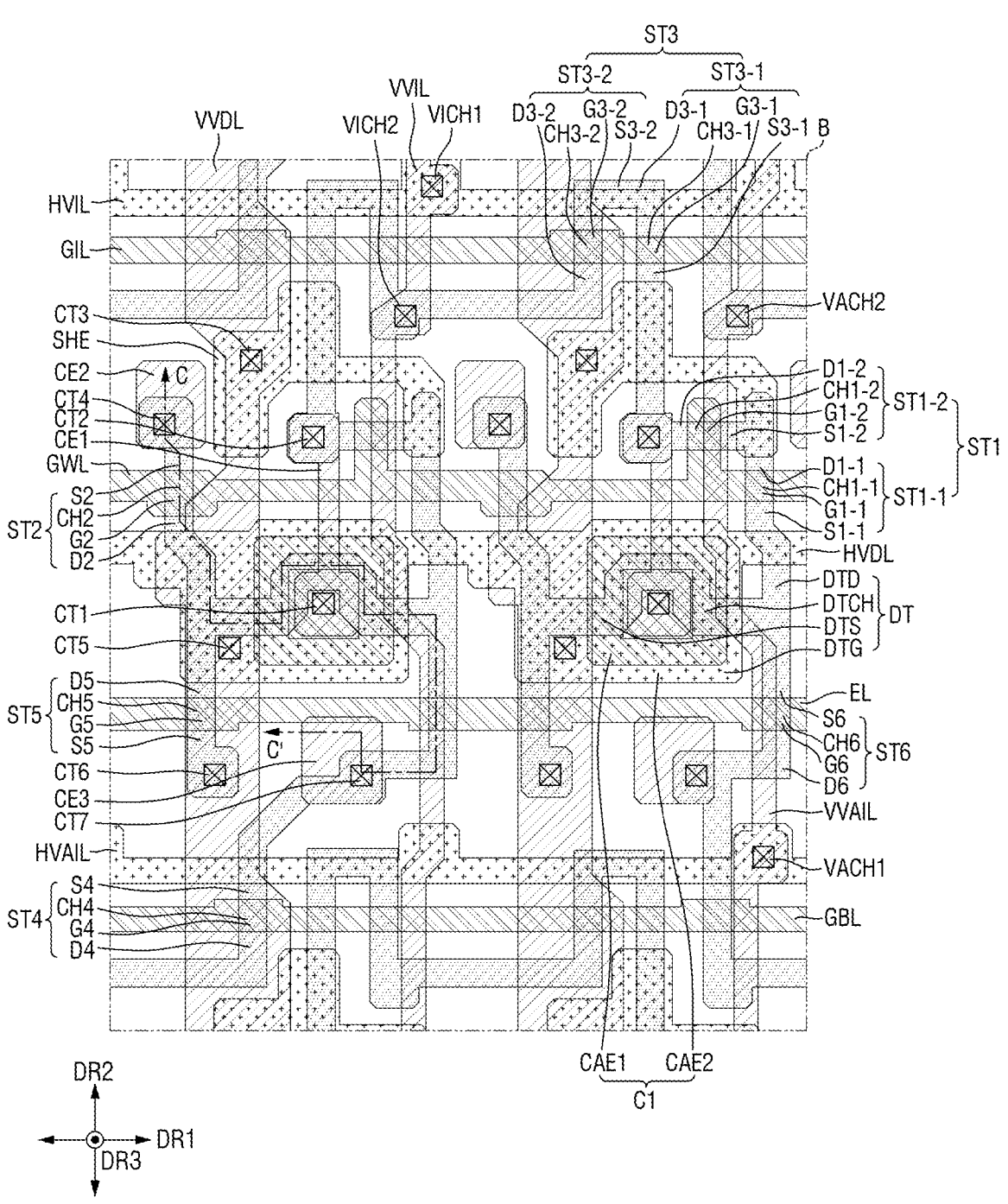
FIG. 24 is a detailed layout view of an example of the area B of FIG. 9 according to some embodiments.
Figure 25:
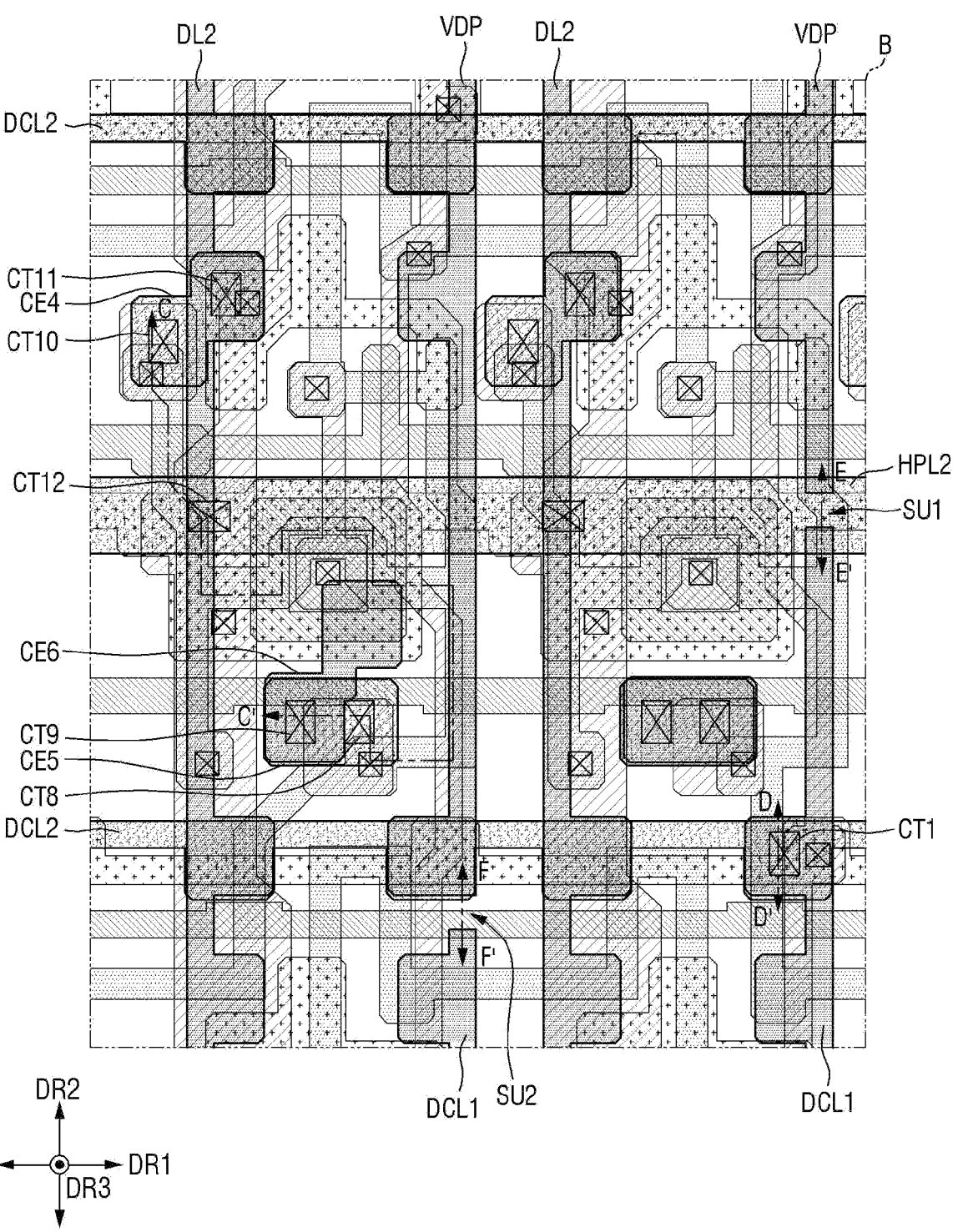
FIG. 25 is an enlarged layout view illustrating an example of the area B of FIG. 9 in more detail according to some embodiments.

FIG. 24 is a detailed layout view of an example of area B of FIG. 9. FIG. 25 is an enlarged layout view illustrating an example of area B of FIG. 9 in more detail.

FIG. 24 illustrates a first active layer, a first gate layer, a second gate layer, and a first source/drain layer of a pixel driver PDU. FIG. 25 illustrates the first active layer, the first gate layer, the second gate layer, the first source/drain layer, a second source/drain layer, and a third source/drain layer of the pixel driver PDU.

Referring to FIGS. 24 and 25, a scan write line GWL, a scan initialization line GIL, a scan bias line GBL, and an emission line EL may extend in the first direction DR1. In addition, a first horizontal initialization line HVIL, a second horizontal initialization line HVAIL, a second horizontal power supply line HPL2, a horizontal driving voltage line HVDL, and second data connection lines DCL2 may extend in the first direction DR1.

A first vertical initialization line VVIL, a second vertical initialization line VVAIL, and vertical driving voltage lines VVDL may extend in the second direction DR2. In addition, second data lines DL2, first data connection lines DCL1, and vertical dummy patterns VDP may extend in the second direction DR2.

The pixel driver PDU may include a driving transistor DT, first through sixth transistors ST1 through ST6, a capacitor C1C1, and connection electrodes CE1 through CE6. The first transistor ST1 may include a (1-1)th transistor ST1-1 and a (1-2)th transistor ST1-2. The third transistor ST3 may include a (3-1)th transistor ST3-1 and a (3-2)th transistor ST3-2.

The driving transistor DT may include a channel layer DTCH, a gate electrode DTG, a first electrode DTS, and a second electrode DTD. The channel layer DTCH of the driving transistor DT may overlap the gate electrode DTG of the driving transistor DT. The gate electrode DTG of the driving transistor DT may be located on the channel layer DTCH of the driving transistor DT.

The gate electrode DTG of the driving transistor DT may be connected to a first connection electrode CE1 through a first contact hole CT1. The first connection electrode CE1 may be connected to a second electrode D1-2 of the (1-2)th transistor ST1-2 through a second contact hole CT2. The first connection electrode CE1 may cross a kth scan control line GCLk.

The first electrode DTS of the driving transistor DT may be connected to a second electrode D2 of the second transistor ST2 and a second electrode D5 of the fifth transistor ST5.

The second electrode DTD of the driving transistor DT may be connected to a first electrode S1-1 of the (1-1)th transistor ST1-1 and a first electrode S6 of the sixth transistor ST6.

The (1-1)th transistor ST1-1 may include a channel layer CH1-1, a gate electrode G1-1, the first electrode S1-1, and a second electrode D1-1. The channel layer CH1-1 of the (1-1)th transistor ST1-1 may overlap the gate electrode G1-1 of the (1-1)th transistor ST1-1. The gate electrode G1-1 of the (1-1)th transistor ST1-1 may be integrally formed with the scan write line GWL. The gate electrode G1-1 of the (1-1)th transistor ST1-1 may be a part of the scan write line GWL. The first electrode S1-1 of the (1-1)th transistor ST1-1 may be connected to the second electrode DTD of the driving transistor DT. The second electrode D1-1 of the (1-1)th transistor ST1-1 may be connected to a first electrode S1-2 of the (ST1-2)th transistor ST1-2.

The (1-2)th transistor ST1-2 may include a channel layer CH1-2, a gate electrode G1-2, the first electrode S1-2, and the second electrode D1-2. The channel layer CH1-2 of the (1-2)th transistor ST1-2 may overlap the gate electrode G1-2 of the (1-2)th transistor ST1-2. The gate electrode G1-2 of the (1-2)th transistor ST1-2 may be integrally formed with the scan write line GWL. The gate electrode G1-2 of the (1-2)th transistor ST1-2 may protrude from the scan write line GWL in the second direction DR2. The first electrode S1-2 of the (1-2)th transistor ST1-2 may be connected to the second electrode D1-1 of the (1-1)th transistor ST1-1. The second electrode D1-2 of the (1-2)th transistor ST1-2 may be connected to the first connection electrode CE1.

The second transistor ST2 may include a channel layer CH2, a gate electrode G2, a first electrode S2, and the second electrode D2. The channel layer CH2 of the second transistor ST2 may overlap the gate electrode G2 of the second transistor ST2. The gate electrode G2 of the second transistor ST2 may be integrally formed with the scan write line GWL. The gate electrode G2 of the second transistor ST2 may be a part of the scan write line GWL. The first electrode S1 of the second transistor ST2 may be connected to a second connection electrode CE2 through a fourth contact hole CT4. The second electrode D2 of the second transistor ST2 may be connected to the first electrode DTS of the driving transistor DT.

The (3-1)th transistor ST3-1 may include a channel layer CH3-1, a gate electrode G3-1, a first electrode S3-1, and a second electrode D3-1. The channel layer CH3-1 of the (3-1)th transistor ST3-1 may overlap the gate electrode G3-1 of the (3-1)th transistor ST3-1. The gate electrode G3-1 of the (3-1)th transistor ST3-1 may be integrally formed with the scan initialization line GIL. The gate electrode G3-1 of the (3-1)th transistor ST3-1 may be a part of the scan initialization line GIL. The first electrode S3-1 of the (3-1)th transistor ST3-1 may be connected to the first connection electrode CE1. The second electrode D3-1 of the (3-1)th transistor ST3-1 may be connected to a first electrode S3-2 of the (ST3-2)th transistor ST3-2.

The (3-2)th transistor ST3-2 may include a channel layer CH3-2, a gate electrode G3-2, the first electrode S3-2, and a second electrode D3-2. The channel layer CH3-2 of the (3-2)th transistor ST3-2 may overlap the gate electrode G3-2 of the (3-2)th transistor ST3-2. The gate electrode G3-2 of the (3-2)th transistor ST3-2 may be integrally formed with the scan initialization line GIL. The gate electrode G3-2 of the (3-2)th transistor ST3-2 may be a part of the scan initialization line GIL. The first electrode S3-2 of the (3-2)th transistor ST3-2 may be connected to the second electrode D3-1 of the (3-1)th transistor ST3-1. The second electrode D3-2 of the (3-2)th transistor ST3-2 may be connected to the first vertical initialization line VVIL through a second initialization contact hole VICH2.

The fourth transistor ST4 may include a channel layer CH4, a gate electrode G4, a first electrode S4, and a second electrode D4. The channel layer CH4 of the fourth transistor ST4 may overlap the gate electrode G4 of the fourth transistor ST4. The gate electrode G4 of the fourth transistor ST4 may be integrally formed with the scan bias line GBL. The gate electrode G4 of the fourth transistor ST4 may be a part of the scan bias line GBL. A kth scan bias line may be a (k+1)th scan initialization line. The first electrode S4 of the fourth transistor ST4 may be connected to a third connection electrode CE3 through a seventh contact hole CT7. The second electrode D4 of the fourth transistor ST4 may be connected to a (the?) second vertical initialization line VVAIL through a fourth contact hole VACH2.

The fifth transistor ST5 may include a channel layer CH5, a gate electrode G5, a first electrode S5, and the second electrode D5. The channel layer CH5 of the fifth transistor ST5 may overlap the gate electrode G5 of the fifth transistor ST5. The gate electrode G5 of the fifth transistor ST5 may be integrally formed with the emission line EL. The gate electrode G5 of the fifth transistor ST5 may be a part of the emission line EL. The first electrode S5 of the fifth transistor ST5 may be connected to a vertical driving voltage line VVDL through a sixth contact hole CT6. The second electrode D5 of the fifth transistor ST5 may be connected to the first electrode DTS of the driving transistor DT.

The sixth transistor ST6 may include a channel layer CH6, a gate electrode G6, the first electrode S6, and a second electrode D6. The channel layer CH6 of the sixth transistor ST6 may overlap the gate electrode G6 of the sixth transistor ST6. The gate electrode G6 of the sixth transistor ST6 may be integrally formed with the emission line EL. The gate electrode G6 of the sixth transistor ST6 may be a part of the emission line EL. The first electrode S6 of the sixth transistor ST6 may be connected to the second electrode DTD of the driving transistor DT. The second electrode D6 of the sixth transistor ST6 may be connected to the third connection electrode CE3 through the seventh contact hole CT7.

A first electrode CAE1 of the capacitor C1 may be integrally formed with the gate electrode DTG of the driving transistor DT. The first electrode CAE1 of the capacitor C1 may be a part of the gate electrode DTG of the driving transistor DT. A second electrode CAE2 of the capacitor C1 may be integrally formed with the horizontal driving voltage line HVDL. The second electrode CAE2 of the capacitor C1 may be a part of the horizontal driving voltage line HVDL. The second electrode CAE2 of the capacitor C1 may overlap the first electrode CAE1 of the capacitor CST. The horizontal driving voltage line HVDL may be connected to each of the vertical driving voltage lines VVDL through a fifth contact hole CT5.

The first connection electrode CE1 may be connected to the gate electrode DTG of the driving transistor DT through the first contact hole CT1 and may be connected to each of the second electrode D1-2 of the (1-2)th transistor ST1-2 and the first electrode S3-1 of the (3-1)th transistor ST3-1 through the second contact hole CT2. The first connection electrode CE1 may extend in the second direction DR2. The first connection electrode CE1 may overlap the scan write line GWL and the horizontal driving voltage line HVDL.

The second connection electrode CE2 may be connected to the first electrode S2 of the second transistor ST2 through the fourth contact hole CT4. A fourth connection electrode CE4 may be connected to the second connection electrode CE2 through a tenth contact hole CT10. Each of the second data lines DL2 may be connected to the fourth connection electrode CE4 through an eleventh contact hole CT11.

The third connection electrode CE3 may be connected to the second electrode D6 of the sixth transistor ST6 through the seventh contact hole CT7. A fifth connection electrode CE5 may be connected to the third connection electrode CE3 through an eighth contact hole CT8. A sixth connection electrode CE6 may be connected to the fifth connection electrode CE5 through a ninth contact hole CT9.

A shielding electrode SHE may be connected to each of the vertical driving voltage lines VVDL through a third contact hole CT3. The shielding electrode SHE may overlap the second electrode D1-2 of the (1-1)th transistor ST1-1 and the first electrode S1-2 of the (1-2)th transistor ST1-2. In addition, the shielding electrode SHE may overlap the first electrode S3-1 of the (3-1)th transistor ST3-1.

The first horizontal initialization line HVIL and the second horizontal initialization line HVAIL may extend in the first direction DR1. The first horizontal initialization line HVIL and the second horizontal initialization line HVAIL may be alternately arranged in the second direction DR2.

The first vertical initialization line VVIL and the second vertical initialization line VVAIL may extend in the second direction DR2. The first vertical initialization line VVIL and the second vertical initialization line VVAIL may be alternately arranged in the second direction DR2.

The first vertical initialization line VVIL may be connected to the first horizontal initialization line HVIL through a first initialization contact hole VICH1. The first vertical initialization line VVIL may be connected to the second electrode D3-2 of the third transistor ST3-2 through the second initialization contact hole VICH2.

The second vertical initialization line VVAIL may be connected to the second horizontal initialization line HVAIL through a third initialization contact hole VACH1. The second vertical initialization line VVAIL may be connected to the second electrode D4 of the fourth transistor ST4 through the fourth initialization contact hole VACH2.

A first initialization voltage may be applied to the first horizontal initialization line HVIL and the first vertical initialization line VVIL, and a second initialization voltage may be applied to the second horizontal initialization line HVAIL and the second vertical initialization line VVAIL.

The first data connection lines DCL1 may be connected to the second data connection lines DCL2 through the first connection holes CH1.

The first separation portion SU1 may be located between one of the first data connection lines DCL1 and one of the vertical dummy patterns VDP and may overlap the second horizontal power supply line HPL2. In addition, the first separation portion SU1 may overlap the horizontal driving voltage line HVDL and the second electrode DTD of the driving transistor DT.

Figure 26:
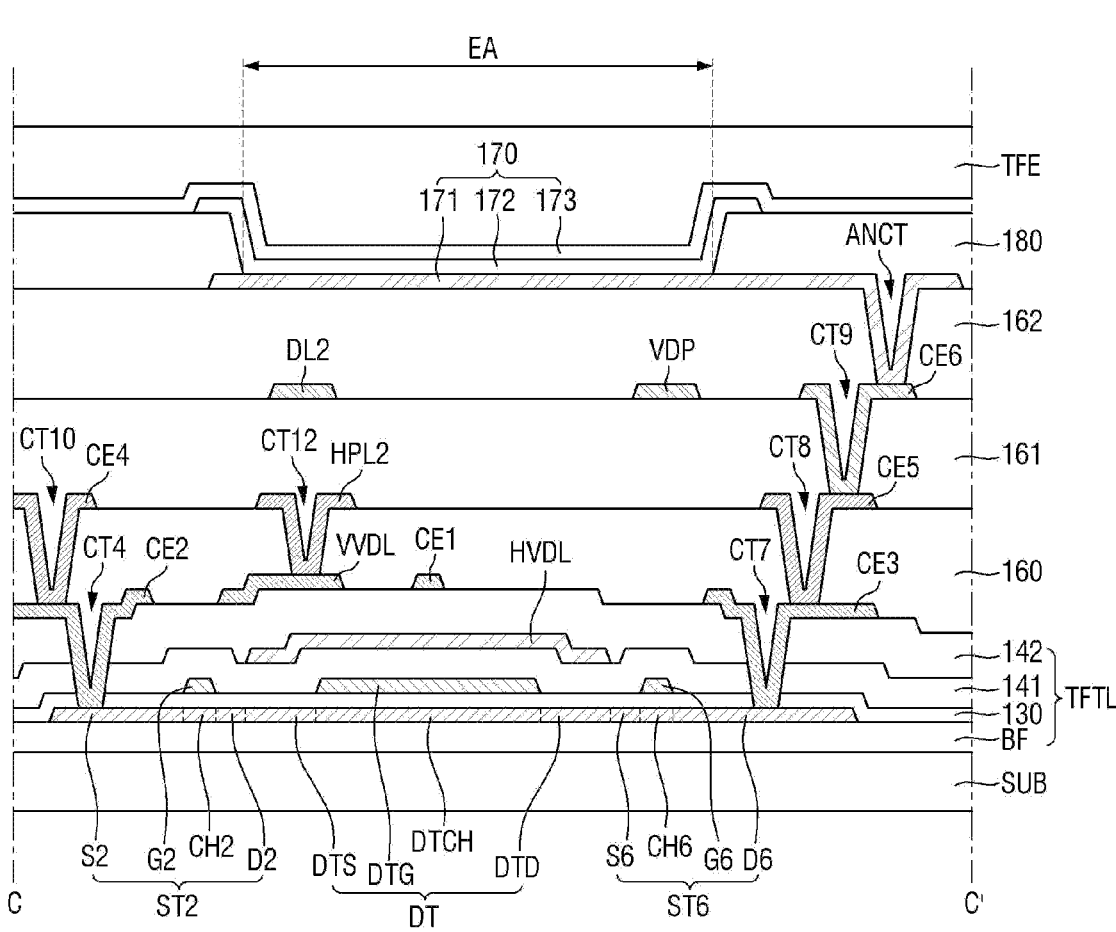
FIG. 26 is a cross-sectional view of an example of the display panel taken along the line C-C' of FIGS. 24 and 25 according to some embodiments.
Figure 26:
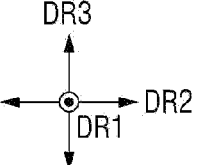
Figure 27:
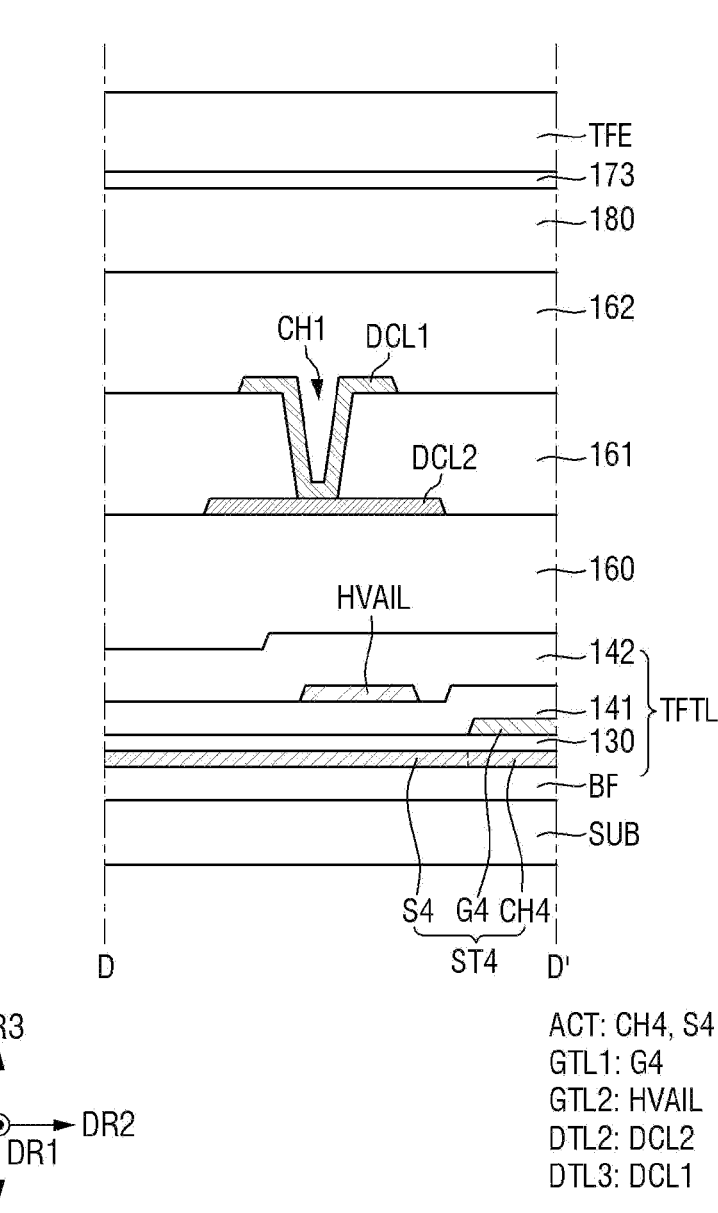
FIG. 27 is a cross-sectional view of an example of the display panel taken along the line D-D' of FIG. 25 according to some embodiments.
Figure 28:
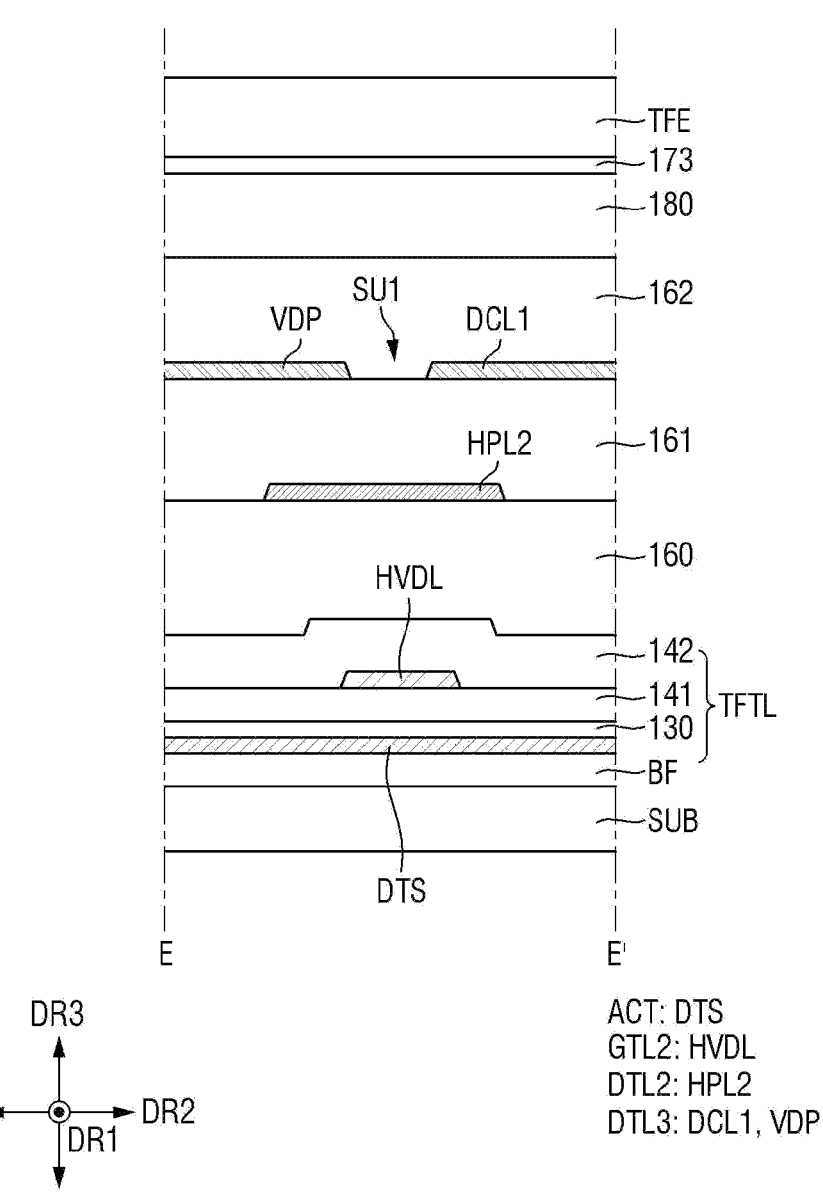
FIG. 28 is a cross-sectional view of an example of the display panel taken along the line E-E' of FIG. 25 according to some embodiments.
Figure 29:
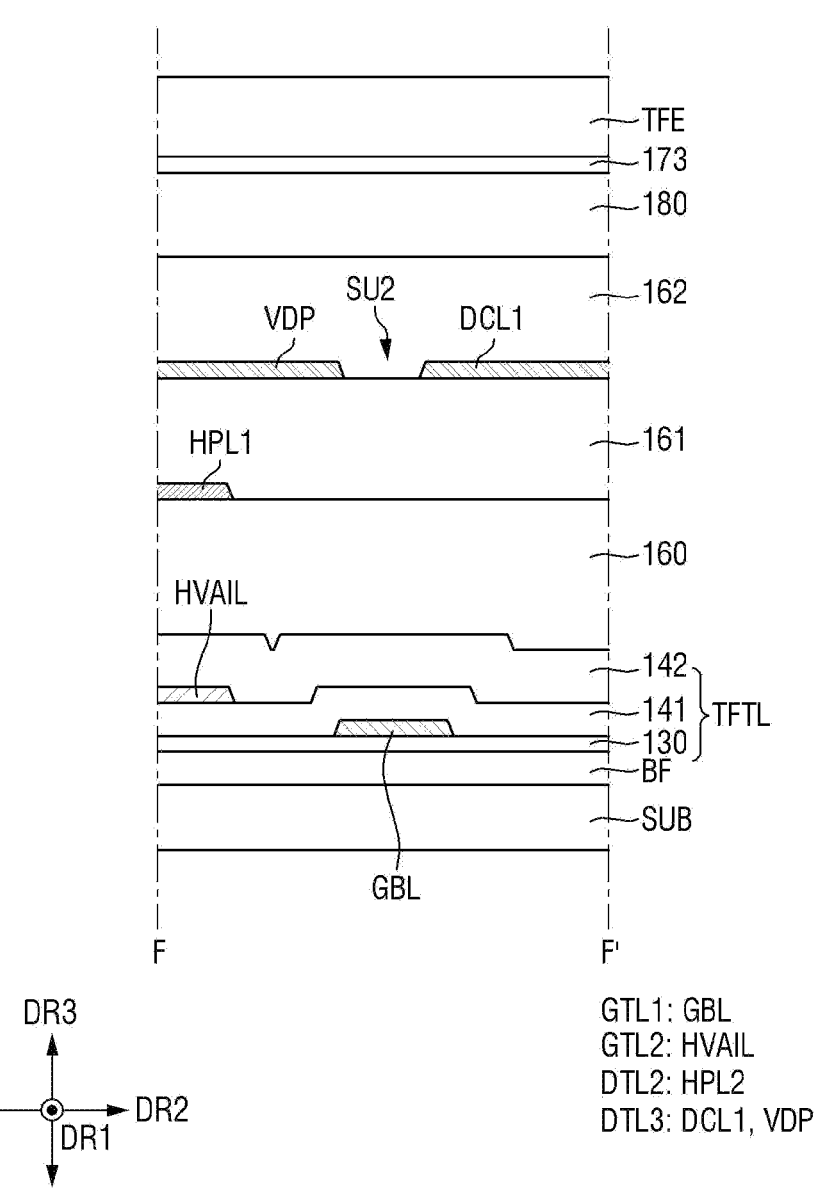
FIG. 29 is a cross-sectional view of an example of the display panel taken along the line F-F' of FIG. 25 according to some embodiments.

FIG. 26 is a cross-sectional view of an example of the display panel 100 taken along the line C-C' of FIGS. 24 and 25. FIG. 27 is a cross-sectional view of an example of the display panel 100 taken along the line D-D' of FIG. 25. FIG. 28 is a cross-sectional view of an example of the display panel 100 taken along the line E-E' of FIG. 25. FIG. 29 is a cross-sectional view of an example of the display panel 100 taken along the line F-F' of FIG. 25.

Referring to FIGS. 26 through 29, the thin-film transistor layer TFTL may be located on the substrate SUB. The thin-film transistor layer TFTL may be a layer in which the driving transistor DT, the first through sixth transistors ST1 through ST6, and the capacitor C1 of each of pixel drivers PDU1 through PDU4 are formed.

The display panel 100 includes the substrate SUB, an active layer ACT, a first gate layer GTL1, a second gate layer GTL2, a first data metal layer DTL1, a second data metal layer DTL2, and a third data metal layer DTL3. In addition, the display panel 100 includes a buffer layer BF, a gate insulating layer 130, a first interlayer insulating film 141, a second interlayer insulating film 142, the first planarization layer 160, the second planarization layer 161, and the third planarization layer 162.

The buffer layer BF may be located on a surface of the substrate SUB. The buffer layer BF may be formed on the surface of the substrate SUB to protect thin-film transistors and an organic light emitting layer 172 of the light emitting element layer EML from moisture introduced through the substrate SUB which is vulnerable to moisture penetration. The buffer layer BF may be composed of a plurality of inorganic layers stacked alternately. For example, the buffer layer BF may be a multilayer in which one or more inorganic layers selected from a silicon nitride layer, a silicon oxynitride layer, a silicon oxide layer, a titanium oxide layer, and an aluminum oxide layer are alternately stacked. The buffer layer BF may also be omitted.

The active layer ACT may be located on the buffer layer BF. The active layer ACT may include a silicon semiconductor such as polycrystalline silicon, monocrystalline silicon, low-temperature polycrystalline silicon, or amorphous silicon.

The active layer ACT may include the channel layer DTCH, the first electrode DTS and the second electrode DTD of the driving transistor DT. The channel layer DTCH of the driving transistor DT may be a region overlapping the gate electrode DTG of the driving transistor DT in the third direction DR3 which is the thickness direction of the substrate SUB. The first electrode DTS of the driving transistor DT may be located on one side of the channel layer DTCH, and the second electrode DTD may be located on the other side of the channel layer DTCH. The first electrode DTS and the second electrode DTD of the driving transistor DT may be regions not overlapping the gate electrode DTG in the third direction DR3. The first electrode DTS and the second electrode DTD of the driving transistor DT may be regions formed to have conductivity by doping a silicon semiconductor with ions or impurities.

In addition, the active layer ACT may further include the channel layers CH1 and CH4 through CH6, the first electrodes S1 and S4 through S6 and the second electrodes D1 and D4 through D6 of the first and fourth through sixth transistors ST1 and ST4 through ST6. Each of the channel layers CH1 and CH4 through CH6 of the first and fourth through sixth transistors ST1 and ST4 through ST6 may overlap a corresponding gate electrode among the gate electrodes G1 and G4 through G6 in the third direction DR3. The first electrodes S1 and S4 through S6 and the second electrodes D1 and D4 through D6 of the first and fourth through sixth transistors ST1 and ST4 through ST6 may be regions formed to have conductivity by doping a silicon semiconductor with ions or impurities.

The gate insulating layer 130 may be located on the active layer ACT. The gate insulating layer 130 may include an inorganic layer, for example, a silicon nitride layer, a silicon oxynitride layer, a silicon oxide layer, a titanium oxide layer, or an aluminum oxide layer.

The first gate layer GTL1 may be located on the gate insulating layer 130. The first gate layer GTL1 may include the gate electrode DTG of the driving transistor DT. In addition, the first gate layer GTL1 may further include the gate electrodes G1 through G6 of the first through sixth transistors ST1 through ST6, the first capacitor electrode CAE1, the scan write lines GWL, the scan initialization lines GIL, the scan bias lines GBL, and the emission lines EL. The first gate layer GTL1 may be a single layer or a multilayer made of any one or more of molybdenum (Mo), aluminum (Al), chromium (Cr), gold (Au), titanium (Ti), nickel (Ni), neodymium (Nd), copper (Cu), and alloys of the same.

The first interlayer insulating film 141 may be located on the first gate layer GTL1. The first interlayer insulating film 141 may include an inorganic layer, for example, a silicon nitride layer, a silicon oxynitride layer, a silicon oxide layer, a titanium oxide layer, or an aluminum oxide layer.

The second gate layer GTL2 may be located on the first interlayer insulating film 141. The second gate layer GTL2 may include the second capacitor electrode CAE2, the shielding electrode SHE, the horizontal driving voltage line HVDL, the first horizontal initialization line HVIL, and the second horizontal initialization line HVAIL. The second gate layer GTL2 may be a single layer or a multilayer made of any one or more of molybdenum (Mo), aluminum (Al), chromium (Cr), gold (Au), titanium (Ti), nickel (Ni), neodymium (Nd), copper (Cu), and alloys of the same.

The second interlayer insulating film 142 may be located on the second gate layer GTL2. The second interlayer insulating film 142 may include an inorganic layer, for example, a silicon nitride layer, a silicon oxynitride layer, a silicon oxide layer, a titanium oxide layer, or an aluminum oxide layer.

The first data metal layer DTL1 including the first through third connection electrodes CE1 through CE3, the vertical driving voltage lines VVDL, the first vertical initialization line VVIL, and the second vertical initialization line VVAIL may be located on the second interlayer insulating film 142. The first data metal layer DTL1 may be a single layer or a multilayer made of any one or more of molybdenum (Mo), aluminum (Al), chromium (Cr), gold (Au), titanium (Ti), nickel (Ni), neodymium (Nd), copper (Cu), and alloys of the same.

The first connection electrode CE1 may be connected to the gate electrode DTG of the driving transistor DT through the first contact hole CT1 passing through the first interlayer insulating film 141 and the second interlayer insulating film 142. The first connection electrode CE1 may be connected to each of the second electrode D1-2 of the (1-2)th transistor ST1-2 and the first electrode S3-1 of the (3-1)th transistor ST3-1 through the second contact hole CT2 passing through the gate insulating layer 130, the first interlayer insulating film 141, and the second interlayer insulating film 142. The second connection electrode CE2 may be connected to the first electrode S2 of the second transistor ST2 through the fourth contact hole CT4 passing through the first interlayer insulating film 141 and the second interlayer insulating film 142. The third connection electrode CE3 may be connected to the second electrode D6 of the sixth transistor ST6 through the seventh contact hole CT7 passing through the gate insulating layer 130, the first interlayer insulating film 141, and the second interlayer insulating film 142.

Each of the vertical driving voltage lines VVDL may be connected to the shielding electrode SHE through the third contact hole CT3 passing through the second interlayer insulating film 142. Each of the vertical driving voltage lines VVDL may be connected to the horizontal driving voltage line HVDL through the fifth contact hole CT5 passing through the second interlayer insulating film 142. Each of the vertical driving voltage lines VVDL may be connected to the first electrode S5 of the fifth transistor ST5 through the sixth contact hole CT6 passing through the gate insulating layer 130, the first interlayer insulating film 141, and the second interlayer insulating film 142. Therefore, the second power supply voltage may be applied to the shielding electrode SHE, the horizontal driving voltage line HVDL, and the first electrode S5 of the fifth transistor ST5.

The first planarization layer 160 may be formed on the first data metal layer DTL1 to flatten steps due to the active layer ACT, the first gate layer GTL1, the second gate layer GTL2, and the first data metal layer DTL1. The first planarization layer 160 may include an organic layer such as acryl resin, epoxy resin, phenolic resin, polyamide resin, or polyimide resin.

The second data metal layer DTL2 may be formed on the first planarization layer 160. The second data metal layer DTL2 may include the fourth connection electrode CE4, the fifth connection electrode CE5, the second data connection lines DCL2, and the second horizontal power supply lines HPL2. In addition, the second data metal layer DTL2 may further include the first horizontal power supply lines HPL1 and the horizontal dummy patterns HDP. The second data metal layer DTL2 may be a single layer or a multilayer made of any one or more of molybdenum (Mo), aluminum (Al), chromium (Cr), gold (Au), titanium (Ti), nickel (Ni), neodymium (Nd), copper (Cu), and alloys of the same.

The fourth connection electrode CE4 may be connected to the second connection electrode CE2 through the tenth contact hole CT10 passing through the first planarization layer 160. The fifth connection electrode CE5 may be connected to the third connection electrode CE3 through the eighth contact hole CT8 passing through the first planarization layer 160. A second horizontal power supply line HPL2 may be connected to each of the vertical driving voltage lines VVDL through a twelfth contact hole CT12.

The second planarization layer 161 may be formed on the second data metal layer DTL2 to flatten steps. The second planarization layer 161 may include an organic layer such as acryl resin, epoxy resin, phenolic resin, polyamide resin, or polyimide resin.

The third data metal layer DTL3 may be formed on the second planarization layer 161. The third data metal layer DTL3 may include the sixth connection electrode CE6, the second data lines DL2, the first data connection lines DCL1, and the vertical dummy patterns VDP. In addition, the third data metal layer DTL3 may further include the first data lines DL1 and the first vertical power supply lines VPL1. The third data metal layer DTL3 may be a single layer or a multilayer made of any one or more of molybdenum (Mo), aluminum (Al), chromium (Cr), gold (Au), titanium (Ti), nickel (Ni), neodymium (Nd), copper (Cu), and alloys of the same.

The sixth connection electrode CE6 may be connected to the fifth connection electrode CE5 through the ninth contact hole CT9 passing through the second planarization layer 161. Each of the second data lines DL2 may be connected to the fourth connection electrode CE4 through the eleventh contact hole CT11 passing through the second planarization layer 161.

Each of the first data connection lines DCL1 may be connected to a second data connection line DCL2 through a first connection hole CH1 passing through the second planarization layer 161. Each of the first data lines DL1 may be connected to a second data connection line DCL2 through a second connection hole CH2 passing through the second planarization layer 161. Each of the first vertical power supply lines VPL1 may be connected to a horizontal dummy pattern HDP through a first power hole PH1, a second power hole PH2, or a third power hole PH3 passing through the second planarization layer 161. Each of the first vertical power supply lines VPL1 may be connected to a first horizontal power supply line HPL1 through a fourth power hole PH4 or a sixth power hole PH6 passing through the second planarization layer 161. Each of the vertical dummy patterns VDP may be connected to a first horizontal power supply line HPL1 through a fifth power hole PH5 passing through the second planarization layer 161.

The third planarization layer 162 may be formed on the third data metal layer DTL3 to flatten steps. The third planarization layer 162 may include an organic layer such as acryl resin, epoxy resin, phenolic resin, polyamide resin, or polyimide resin.

Light emitting elements 170 and a bank 180 may be located on the third planarization layer 162. Each of the light emitting elements 170 may include the pixel electrode 171, the organic light emitting layer 172, and a common electrode 173. The light emitting elements 170 may share the common electrode 173.

The pixel electrode 171 of each of the light emitting elements 170 may be formed on the third planarization layer 162. The pixel electrode 171 of each of the light emitting elements 170 may be connected to the sixth connection electrode CE6 through a pixel contact hole ANCT passing through the third planarization layer 162. The pixel electrode 171 of each of the light emitting elements 170 may include a metal material having high reflectivity, such as a stacked structure (Ti/Al/Ti) of aluminum and titanium, a stacked structure (ITO/Al/ITO) of aluminum and indium tin oxide, an APC alloy, or a stacked structure (ITO/APC/ITO) of an APC alloy and indium tin oxide. The APC alloy is an alloy of silver (Ag), palladium (Pd), and copper (Cu).

The bank 180 may be a pixel defining layer or a light emitting part defining layer which defines light emitting parts EA. The bank 180 may separate the light emitting parts EA. Each of the light emitting parts EA is an area in which the pixel electrode 171, the organic light emitting layer 172, and the common electrode 173 are sequentially stacked so that holes from the pixel electrode 171 and electrons from the common electrode 173 recombine in the organic light emitting layer 172 to emit light.

The bank 180 may be formed to cover edges of the pixel electrode 171 of each of the light emitting elements 170. The bank 180 may include an organic layer such as acryl resin, epoxy resin, phenolic resin, polyamide resin, or polyimide resin.

The organic light emitting layer 172 is formed on the pixel electrode 171 of each of the light emitting elements 170. The organic light emitting layer 172 may include an organic material to emit light of a predetermined color. For example, the organic light emitting layer 172 may include a hole transporting layer, an organic material layer, and an electron transporting layer.

The common electrode 173 may be located on the organic light emitting layer 172 and the bank 180. The common electrode 173 may be formed to cover the organic light emitting layer 172. The common electrode 173 may be formed in common to the light emitting parts EA. A capping layer may be formed on the common electrode 173.

In a top emission structure, the common electrode 173 may include a transparent conductive material (TCO) capable of transmitting light, such as indium tin oxide (ITO) or indium zinc oxide (IZO), or a semi-transmissive conductive material such as magnesium (Mg), silver (Ag) or an alloy of Mg and Ag. When the common electrode 173 includes a semi-transmissive conductive material, the light output efficiency of each of the light emitting parts EA may be increased by a microcavity.

The encapsulation layer TFEL may be formed on the light emitting elements 170. The encapsulation layer TFEL may include at least one inorganic layer to prevent oxygen or moisture from permeating into the light emitting element layer EML. In addition, the encapsulation layer TFEL may include at least one organic layer to protect the light emitting element layer EML from foreign substances such as dust.

In the embodiments illustrated with respect to FIGS. 24 through 29, the display panel 100 includes the third data metal layer DTL3. However, the third data metal layer DTL3 may also be omitted from the display panel 100 in some embodiments. In this case, the second data connection lines DCL2 and the second horizontal power supply lines HPL2 may be included in the first data metal layer DTL1, and the first data lines DL1, the second data lines DL2, the first data connection lines DCL1, the vertical dummy patterns VDP and the first vertical power supply lines VPL1 may be included in the second data metal layer DTL2.

Figure 30:
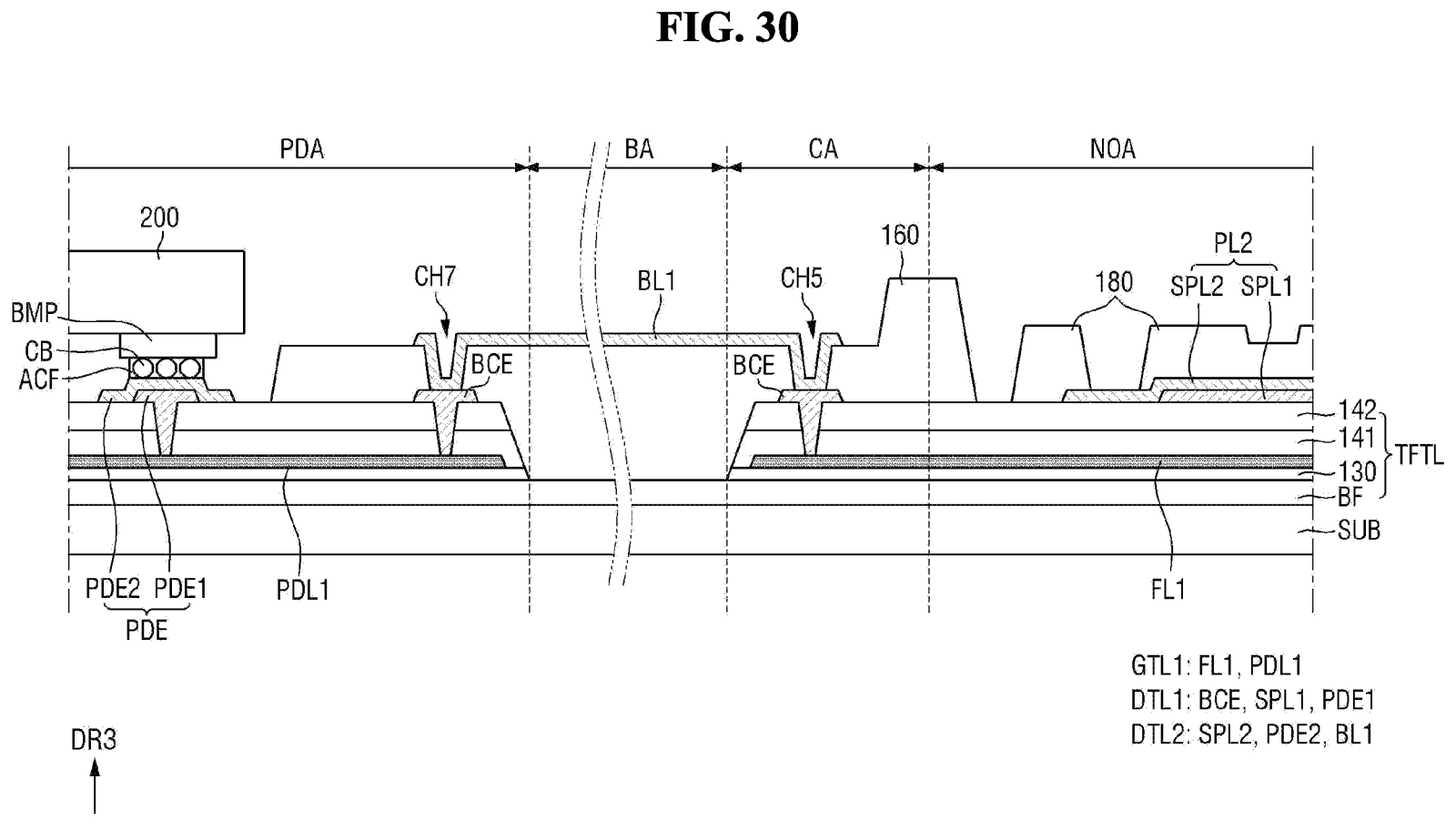
Figure 31:
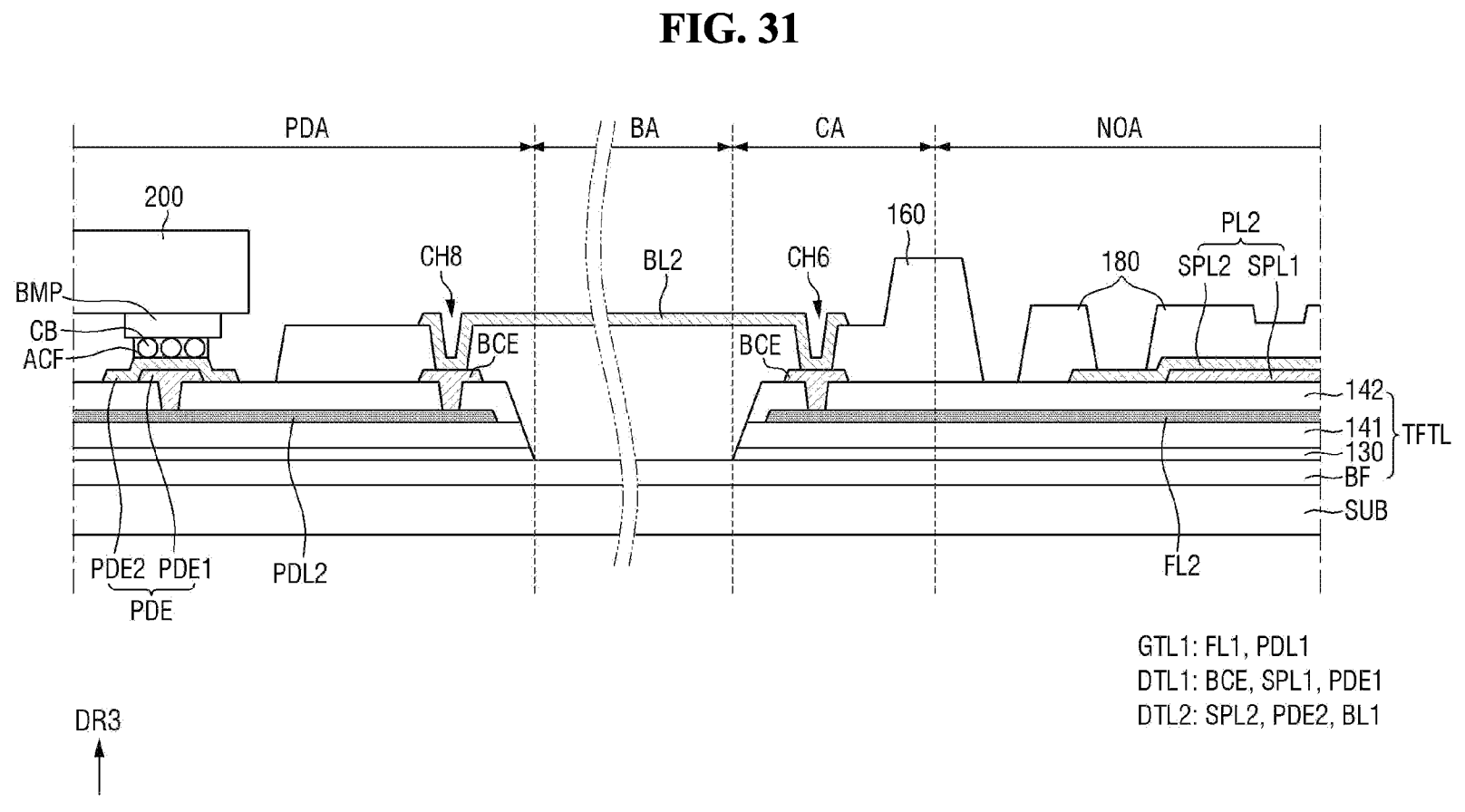

FIG. 30 is a cross-sectional view illustrating an example of a first fan-out line FL1, a first bending line BL1, and a first pad line PDL1 according to some embodiments. FIG. 31 is a cross-sectional view illustrating an example of a second fan-out line FL2, a second bending line BL2, and a second pad line PDL2 according to some embodiments.

Referring to FIGS. 30 and 31, the first gate layer GTL1 may further include the first fan-out lines FL1 and the first pad lines PDL1, and the second gate layer GTL2 may further include the second fan-out lines FL2 and the second pad lines PDL2. The first fan-out lines FL1 and the second fan-out lines FL2 may be alternately arranged in the first direction DR1. The first pad lines PDL1 and the second pad lines PDL2 may be alternately arranged in the first direction DR1.

A second power supply line PL2 may include a first sub-power supply line SPL1 and a second sub-power supply line SPL2. The second sub-power supply line SPL2 may cover the first sub-power supply line SPL1. The second sub-power supply line SPL2 may contact an upper surface of the first sub-power supply line SPL1.

Pad electrodes PDE may include a first pad electrode PDE1 and a second pad electrode PDE2. The second pad electrode PDE2 may cover the first pad electrode PDE1. The second pad electrode PDE2 may contact an upper surface of the first pad electrode PDE1.

The first data metal layer DTL1 may include the first sub-power supply line SPL1, a bending connection electrode BCE and the first pad electrode PDE1, and the second data metal layer DTL2 may include the second sub-power supply line SPL2, the first bending line BL1, the second bending line BL2 and the second pad electrode PDE2.

The bending connection electrode BCE may be connected to the first fan-out line FL1 through a contact hole passing through the first interlayer insulating film 141 and the second interlayer insulating film 142 or may be connected to the second fan-out line FL2 through a contact hole passing through the second interlayer insulating film 142. The first bending line BL1 may be connected to the bending connection electrode BCE connected to the first fan-out line FL1 through a fifth connection hole CH5. The first bending line BL1 may be connected to the bending connection electrode BCE connected to the first pad line PDL1 through a seventh connection electrode CH7. The second bending line BL2 may be connected to the bending connection electrode BCE connected to the second fan-out line FL2 through a sixth connection hole CH6. The second bending line BL2 may be connected to the bending connection electrode BCE connected to the second pad line PDL2 through an eighth connection hole CH8.

The first pad electrode PDE1 may be connected to the first pad line PDL1 through a contact hole passing through the first interlayer insulating film 141 and the second interlayer insulating film 142 or may be connected to the second pad line PDL2 through a contact hole passing through the second interlayer insulating film 142. The second pad electrode PDE2 may be connected to a bump BMP of the display driving circuit 200 through a conductive adhesive member ACF such as an anisotropic conductive film. The conductive adhesive member ACF may include conductive balls CB.

However, the aspects and features of embodiments of the present disclosure are not restricted to the one set forth herein. The above and other aspects of the present disclosure will become more apparent to one of daily skill in the art to which the present disclosure pertains by referencing the claims, with functional equivalents thereof to be included therein.

What is claimed is:

1. A display device comprising:
a plurality of first data lines extending in a second direction intersecting a first direction;
a plurality of second data lines extending in the second direction and spaced apart from the first data lines;
a plurality of data connection lines connected to the first data lines, respectively;
a plurality of vertical dummy patterns spaced apart from all of the data connection lines and extending in the second direction; and a plurality of horizontal power supply lines in a display area and extending in the first direction and configured to receive a power supply voltage,
wherein a first separation portion by which any one data connection line among the data connection lines is spaced apart from any one vertical dummy pattern among the vertical dummy patterns overlaps any one horizontal power supply line among the horizontal power supply lines.

2. The display device of claim 1, wherein a second separation portion by which another data connection line among the data connection lines is spaced apart from another vertical dummy pattern among the vertical dummy patterns does not overlap the horizontal power supply lines.

3. The display device of claim 2, wherein each of the another data connection line and the another vertical dummy pattern comprises a first wiring portion having a first width and a second wiring portion having a second width greater than the first width.

4. The display device of claim 3, wherein the first separation portion is defined as a gap between the first wiring portion of the data connection line and the first wiring portion of the vertical dummy pattern.

5. The display device of claim 3, wherein the second separation portion is defined as a gap between the first wiring portion of the another data connection line and the second wiring portion of the another vertical dummy pattern or a gap between the second wiring portion of the another data connection line and the first wiring portion of the another vertical dummy pattern.

6. The display device of claim 3, wherein the second separation portion is defined as a gap between the second wiring portion of the another data connection line and the second wiring portion of the another vertical dummy pattern.

7. The display device of claim 1, wherein each of the data connection lines comprises:
a first data connection line extending in the second direction; and
a second data connection line extending in the first direction.

8. The display device of claim 7, wherein the first data lines, the second data lines, the vertical dummy patterns, and the first data connection line include a same material and on a same layer.

9. The display device of claim 7, wherein the horizontal power supply lines and the second data connection line include a same material and on a same layer.

10. A display device comprising:
a plurality of first horizontal power supply lines extending in a first direction and configured to receive a first power supply voltage;
a plurality of second horizontal power supply lines extending in the first direction and configured to receive a second power supply voltage higher than the first power supply voltage;
a plurality of first data lines extending in a second direction intersecting the first direction;
a plurality of second data lines extending in the second direction and spaced apart from the first data lines;
a plurality of data connection lines connected to the first data lines, respectively; and
a plurality of vertical dummy patterns spaced apart from the data connection lines and extending in the second direction, wherein any one first horizontal power supply line among the first horizontal power supply lines is connected to any one vertical dummy pattern among the vertical dummy patterns.

11. The display device of claim 10, further comprising:

a plurality of horizontal dummy patterns extending in the first direction; and a plurality of vertical power supply lines extending in the second direction and configured to receive the first power supply voltage, wherein any one vertical power supply line among the vertical power supply lines is connected to any one horizontal dummy pattern among the horizontal dummy patterns.

12. The display device of claim 10, wherein a first separation portion by which any one data connection line among the data connection lines is spaced apart from any one vertical dummy pattern among the vertical dummy patterns overlaps any one second horizontal power supply line among the second horizontal power supply lines.

13. The display device of claim 10, wherein a second separation portion by which any one data connection line among the data connection lines is spaced apart from any one vertical dummy pattern among the vertical dummy patterns does not overlap the second horizontal power supply lines.

14. A display device comprising:

a first display area having a first sub-display area and a second sub-display area;

a second display area neighboring the first display area in a first direction;

a plurality of first data lines in the first sub-display area and extending in a second direction intersecting the first direction;

a plurality of first data connection lines in the second sub-display area and extending in the second direction;

a plurality of second data connection lines in the first sub-display area and the second sub-display area and extending in the first direction;

a plurality of first connection holes through which the first data connection lines and the second data connection lines are respectively connected to each other in the second sub-display area; and a plurality of second connection holes through which the second data connection lines and the first data lines are respectively connected to each other in the first sub-display area, wherein the first connection holes are arranged in a first diagonal direction between the first direction and the second direction in the second sub-display area, wherein the second data connection lines are electrically connected to the first data lines, respectively, and wherein the second connection holes are arranged in a second diagonal direction intersecting the first diagonal direction in the first sub-display area.

15. The display device of claim 14, further comprising a plurality of second data lines in the second sub-display area, extending in the second direction, and spaced apart from the first data connection lines.

16. The display device of claim 14, further comprising:

a third display area neighboring the first display area in the second direction and comprising a third sub-display area and a fourth sub-display area;

a plurality of first horizontal power supply lines in the third sub-display area and the fourth sub-display area and extending in the first direction and configured to receive a first power supply voltage; and a plurality of vertical dummy patterns in the second sub-display area and the fourth sub-display area and extending in the second direction.

17. The display device of claim 16, further comprising a plurality of first power holes through which the first horizontal power supply lines and the vertical dummy patterns are respectively connected to each other in the fourth sub-display area, wherein the first power holes are arranged in the first diagonal direction between the first direction and the second direction in the fourth sub-display area.

18. The display device of claim 17, further comprising:

a plurality of vertical power supply lines in the third sub-display area and extending in the second direction; and a plurality of second power holes through which the first horizontal power supply lines and the vertical power supply lines are respectively connected to each other in the third sub-display area, wherein the second power holes are arranged in the second diagonal direction intersecting the first diagonal direction in the third sub-display area.

19. The display device of claim 18, further comprising:

a plurality of horizontal dummy patterns in the first sub-display area and the second sub-display area and extending in the first direction; and a plurality of third power holes through which the horizontal dummy patterns and the vertical power supply lines are respectively connected to each other in the first sub-display area, wherein the vertical power supply lines extend in the second direction in the first sub-display area, and the third power holes are arranged in the second diagonal direction in the first sub-display area.

* * * * *